United States Patent
Takahashi et al.

(10) Patent No.: US 6,734,497 B2
(45) Date of Patent: May 11, 2004

(54) INSULATED GATE BIPOLAR TRANSISTOR, SEMICONDUCTOR DEVICE, METHOD OF MANUFACTURING INSULATED-GATE BIPOLAR TRANSISTOR, AND METHOD OF MANUFACTURING SEMICONDUCTOR DEVICE

(75) Inventors: Hideki Takahashi, Tokyo (JP); Yoshifumi Tomomatsu, Fukuoka (JP); Mitsuharu Tabata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/239,212

(22) PCT Filed: Feb. 2, 2001

(86) PCT No.: PCT/JP01/00777

§ 371 (c)(1),
(2), (4) Date: Sep. 27, 2002

(87) PCT Pub. No.: WO02/063695

PCT Pub. Date: Aug. 15, 2002

(65) Prior Publication Data

US 2003/0042575 A1 Mar. 6, 2003

(51) Int. Cl.$^7$ .............................................. H01L 23/58
(52) U.S. Cl. ..................... 257/341; 257/138; 257/142; 257/342; 438/328
(58) Field of Search ................... 257/565–612, 257/401, 341–345, 138–145; 438/309–328, 350

(56) References Cited

U.S. PATENT DOCUMENTS

| | | | |
|---|---|---|---|
| 5,548,133 A | * | 8/1996 | Kinzer .......................... 257/155 |
| 5,567,629 A | * | 10/1996 | Kubo .......................... 438/286 |
| 5,751,024 A | | 5/1998 | Takahashi |
| 5,801,408 A | | 9/1998 | Takahashi |
| 5,864,159 A | | 1/1999 | Takahashi |
| 5,981,981 A | | 11/1999 | Takahashi |
| 6,008,518 A | | 12/1999 | Takahashi |
| 6,040,599 A | | 3/2000 | Takahashi |
| 6,107,650 A | | 8/2000 | Takahashi et al. |
| 6,118,150 A | | 9/2000 | Takahashi |
| 6,198,130 B1 | | 3/2001 | Nobuto et al. |
| 6,221,721 B1 | | 4/2001 | Takahashi |
| 6,323,508 B1 | | 11/2001 | Takahashi et al. |
| 6,323,509 B1 | | 11/2001 | Kusunoki |
| 6,331,466 B1 | | 12/2001 | Takahashi et al. |
| 6,472,693 B1 | | 10/2002 | Takahashi et al. |

FOREIGN PATENT DOCUMENTS

| | | |
|---|---|---|
| EP | 368246 | 5/1990 |
| JP | 5-67776 | 3/1993 |
| JP | 6-053511 | 2/1994 |
| JP | 6-132424 | 5/1994 |
| JP | 6-326317 | 11/1994 |
| JP | 7-153942 | 6/1995 |
| JP | 9-232341 | 9/1997 |
| JP | 11-54747 | 2/1999 |
| JP | 2000-200906 | 7/2000 |

* cited by examiner

*Primary Examiner*—H. Jey Tsai
(74) *Attorney, Agent, or Firm*—Oblon, Spivak, McClelland, Maier & Neustadt, P.C.

(57) ABSTRACT

An insulated gate bipolar transistor, a semiconductor device using such a transistor, and manufacturing methods of these. The transistor, device, and method eliminate the necessity of connection to a freewheel diode used for bypassing a circulating current. In the transistor, device, and method the concentration of impurities of an N+ buffer layer that forms a junction with a P+ collector layer is increased so that it is possible to reduce an avalanche breakdown voltage of a parasitic diode formed by an N base layer and the P+ collector layer. Thus, the reverse voltage resistance of an IGBT is lowered to not more than 5 times the collector-emitter saturated voltage.

18 Claims, 21 Drawing Sheets

F I G. 3
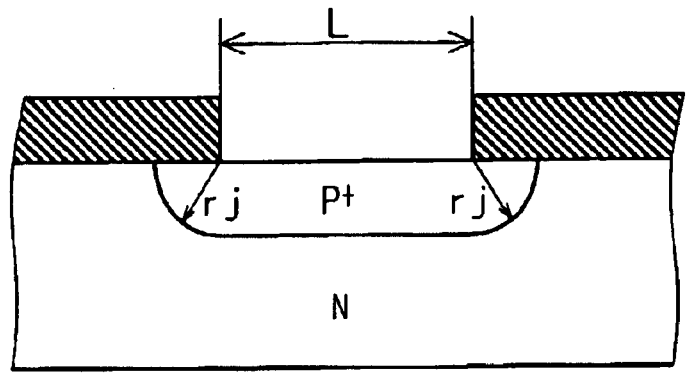
F I G. 4
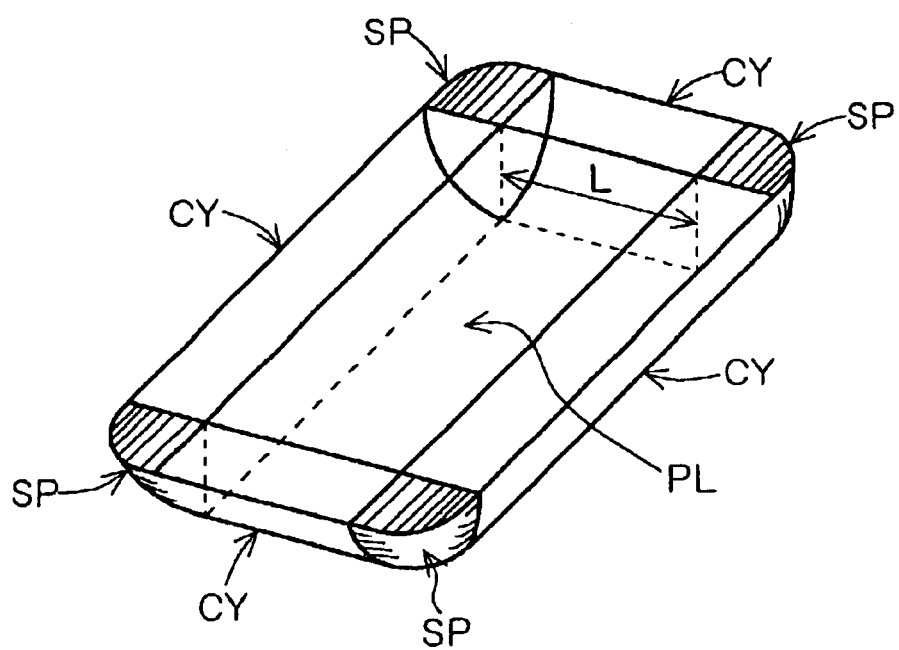

F I G. 26
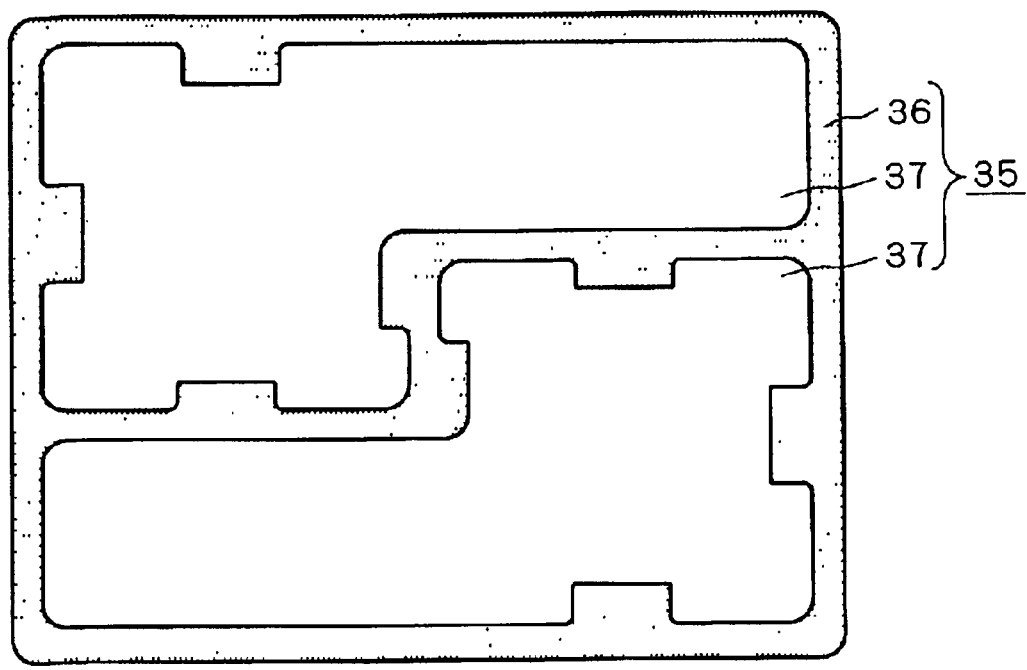

F I G. 33
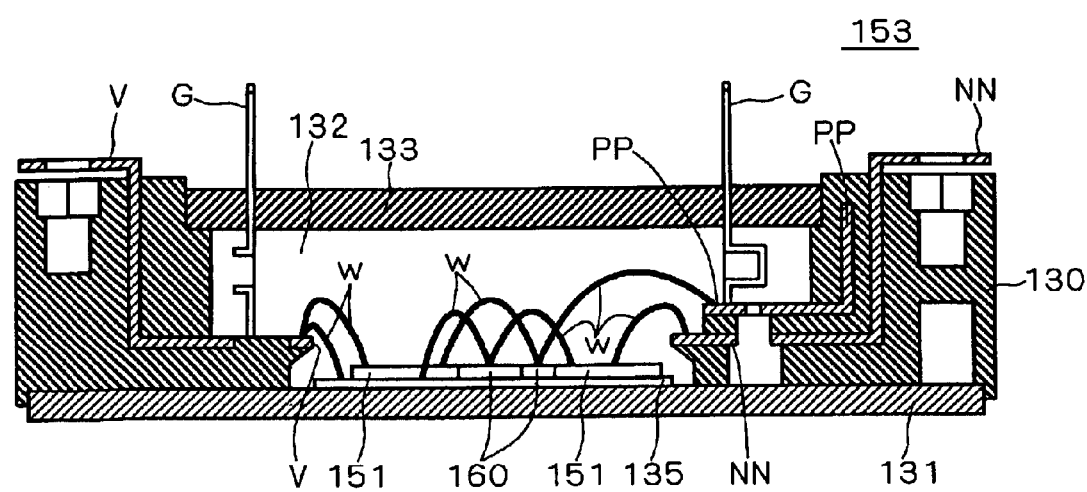

F I G. 34
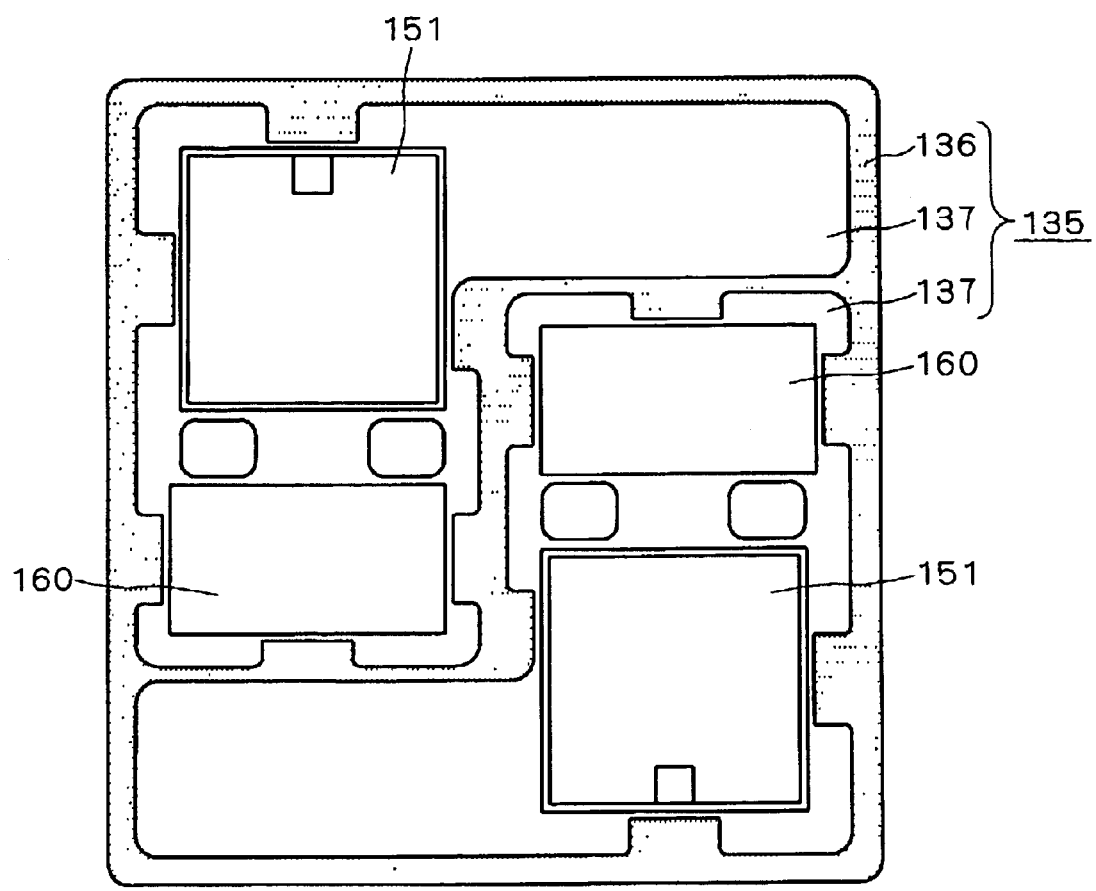

F I G. 35
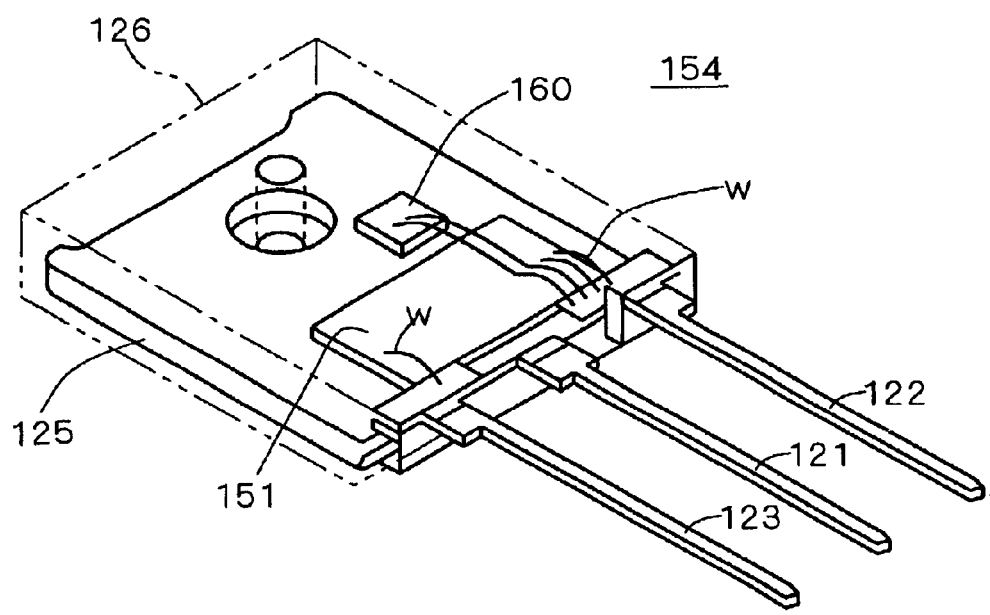

INSULATED GATE BIPOLAR TRANSISTOR, SEMICONDUCTOR DEVICE, METHOD OF MANUFACTURING INSULATED-GATE BIPOLAR TRANSISTOR, AND METHOD OF MANUFACTURING SEMICONDUCTOR DEVICE

TECHNICAL FIELD

The present invention relates to an insulated gate bipolar transistor, a manufacturing method of such a transistor, a semiconductor device using such an insulated gate bipolar transistor and a manufacturing method thereof.

BACKGROUND ART

In a power semiconductor device for driving a load such as a motor, an insulated gate bipolar transistor (referred to simply as an IGBT) is used in a rated voltage area of not less than 300 V as a switching element installed therein so as to provide a better characteristic. In this case, a circulating diode parallel-connected to the switching element is used at the same time.

FIG. 29 is a front cross-sectional view that shows a conventional IGBT. This IGBT 151 comprises a semiconductor substrate 90 having first and second major surfaces. This semiconductor substrate 90, which is a silicon substrate, comprises a P$^+$ collector layer 91 that is a P$^+$ substrate exposed to the first major surface, an N$^+$ buffer layer 92 formed thereon, an N$^-$ base layer 93 that is formed thereon, and has a lower concentration of impurities than the N$^+$ buffer layer 92, a P base region 2 that is formed by selectively diffusing P-type impurities on the second major surface to which the N$^-$ base layer 93 is exposed, and an N$^+$ source region 3 that is formed as a shallower region than the P base region 2 by selectively diffusing N-type impurities with a high concentration inside this P base region 2.

On the second major surface of the semiconductor substrate 90 is formed a gate insulating film 4 made of a silicon dioxide in a manner so as to cover one portion of a surface of P the base region 2 and a surface of the N$^-$ base layer 93. A gate electrode 5 made of polysilicon is formed on the gate insulating film 4. On the upper major surface of the semiconductor substrate 90, an emitter electrode 7 is further formed so as to connect one portion of the surface of the N$^+$ source region 3 and a center area of the surface of the P base region 2. The gate electrode 5 and the emitter electrode 7 are insulated from each other by an interlayer insulating film 6.

Therefore, the N$^-$ base layer 93, the P base region 2 and the N$^+$ source region 3, which are formed on the second major surface side of the semiconductor substrate 90, correspond to a semiconductor portion of an MOS transistor. The portion having the same structure as the MOS transistor, which is formed on the second major surface of the semiconductor substrate 90, is referred to as an MOS structure M. A portion of the surface of the P base region 2, which is located right below the gate electrode 5, and sandwiched by the source region 3 and the N$^-$ base layer 93, that is, a portion at which the gate electrodes 5 face each other with the gate insulating film 4 sandwiched in between, corresponds to a channel region CH of the MOS structure M. The P base region 2 and the N$^+$ source region 3 are formed by selectively implanting and diffusing impurities by using the gate electrode 5 as a mask. That is, since the P base region 2 and the N$^+$ source region 3 form a double diffusion region, the MOS structure M forms one example of a Double Diffused MOS (referred to simply as a DMOS). A collector electrode 8 to be connected to the P$^+$ collector layer 91 is formed on the first major surface of the semiconductor substrate 90.

FIG. 30 is a front cross-sectional view of an insulated gate bipolar transistor in accordance with another conventional example. This IGBT151$a$ is typically different from IGBT151 in its MOS structure M formed on the second major surface side of the semiconductor substrate 90. A trench 9, which penetrates an N$^+$ source region 3 and a P base region 2 to reach an N$^-$ base layer 93, is formed on the second major surface, and a gate insulating film 4 is formed in a manner so as to cover the inner wall face thereof. Moreover, a gate electrode 5 is buried inside the gate insulating film 4. In this IGBT151$a$ also, a portion of a surface of the P base region 2 (which includes a surface exposed to the trench 9), which is sandwiched by the N$^+$ source region 3 and an N$^-$ base layer 93, that is, a portion at which the gate electrodes 5 face each other with the gate insulating film 4 sandwiched in between, corresponds to a channel region CH of an MOS transistor.

In this manner, each of the planar IGBT151 of FIG. 29 and the trench-type IGBT151$a$ of FIG. 30 comprises the P$^+$ collector layer 91 that is exposed to the first major surface of the semiconductor substrate 90, the N base layers 92, 93 formed thereon, the MOS structure M (including one portion of the N$^-$ base layer 93) formed on the second major surface and the collector electrode 8 that is formed on the first major surface and connected to the P$^+$ collector layer 91. Normally, a number of cells, shown in FIGS. 29 and 30, are reciprocally arranged along the major surfaces of the semiconductor substrate 90 so that a greater current rate is obtained by this arrangement. In FIG. 29, one cell is drawn, and in FIG. 30, two cells are drawn.

Next, the operations of IGBT151 and 151$a$ will be described. In the structures of FIGS. 29 and 30, with a predetermined collector-emitter voltage (referred to as a collector voltage) $V_{CE}$ being applied between the emitter electrode 7 and the collector electrode 8, a gate-emitter voltage (referred to as a gate voltage) $V_{GE}$ with a positive bias having a predetermined level is applied between the emitter electrode 7 and the gate electrode 5; that is, upon turning on the gate, the conductive type of the channel region CH is inverted from a P type to an N type. As a result, a channel serving as a carrier path is formed in the channel region CH. Electrons are injected from the emitter electrode 7 to the N$^-$ base layer through this channel. The electrons thus injected make the P$^+$ collector layer 91 and the N base layers 92, 93 forwardly biased so that holes are injected to the N base layers 92, 93 from the P$^+$ collector layer 91. As a result, the resistance of the N$^-$ base layer 92 drops greatly so that the current capacity of the IGBT151, 151$a$ is increased.

Next, when the gate voltage $V_{GE}$ is set from a positive bias value to 0 or a reverse bias value, that is, when the gate is turned off, the channel region CH, inverted to the N type, is restored to the P type. Consequently, the injection of electrons from the emitter electrode 7 is stopped. The stop of injection of electrons also stops the injection of holes from the P$^+$ collector layer 91. Thereafter, electrons and holes, accumulated in the N base layers 92, 93, are either drawn into the collector electrode 8 and the emitter electrode 7, respectively, or recombined with each other to disappear.

Next, a description will be given of a semiconductor device as a typical applied apparatus of the conventional IGBTs151 and 151$a$. FIG. 31 is a circuit diagram (in which 151 is typically added as a reference number for an IGBT)

of a semiconductor device using the IGBTs151, 151a as switching elements. This semiconductor device 152 is formed as a three-phase inverter. Freewheel diodes 160 are parallel-connected to six IGBTs151, respectively. Freewheel diodes 160 are connected in such a direction that the reverse current of the corresponding IGBT151 is bypassed. The parallel connection in this direction is also referred to as "reverse parallel connection".

With respect to six IGBTs151, every two of them are series-connected. The collector electrode 8 of one of two series-connected IGBTs151 is connected to a higher potential power-supply terminal PP, and the emitter electrode 7 of the other is connected to a lower potential power-supply terminal NN. That is, three series circuits, each having two IGBTs151, are connected in parallel with each other between the higher potential power-supply terminal PP and the lower potential power-supply terminal NN. An external d-c power-supply 20 is connected to the higher potential power supply terminal PP and the lower potential power-supply terminal NN so as to supply a direct-current voltage. In each of the series circuits, a connected portion of two IGBTs151 series-connected is connected to any one of output terminals U, V, W. For example, a load 21 of, for example, a three-phase motor is connected to the three-phase output terminals U, V, W. A gate voltage $V_{GE}$ is externally applied to each of six gate electrodes 5 placed in six IGBTs151 individually so that six IGBTs151 are selectively turn on and off. Thus, three-phase alternating currents are supplied to the load 21. Here, a single-phase inverter, constituted by removing one of the three series circuits from the semiconductor device 152 of FIG. 31, has been conventionally used.

FIG. 32 is a plan view of a conventionally-known semiconductor device that shows a specific construction of the semiconductor device (that is, a three-phase inverter) of FIG. 31, and FIG. 33 is a cross-sectional view of the semiconductor device taken along a cutting line X—X of FIG. 32. The circuit diagram of this semiconductor device 153 is shown in FIG. 31. The semiconductor device 153 comprises a housing 130, a heat-radiating plate 131 formed as one portion thereof, a substrate 135 placed on the heat-radiating plate 131, the six IGBTs151 placed on the substrate 135, the six freewheel diodes 160 also placed on the substrate 135, the higher potential power-supply terminal PP, the lower potential power-supply terminal NN, the three output terminals U, V, W, the six gate terminals G, a plurality of conductive wires w and a lid 133.

The housing 130 (including the heat-radiating plate 131) and the lid 133 cooperatively form a closed space 132, and the substrate 135 is mounted in this closed space 132. Each of the higher potential power-supply terminal PP, the lower potential power-supply terminal NN, the three output terminals U, V, W, and the six gate terminals G, is buried in the housing 130 so that its upper end portion protrudes from an upper portion of the housing 130, and its lower end portion is exposed to the closed space 132. The six IGBTs151 and the six freewheel diodes 160 are connected to the eleven terminals PP, NN, U, V, W, G through a number of conductive wires w. The conductive wires w are, for example, aluminum wires. Here, FIG. 32 shows the semiconductor device 153 with its lid 133 removed.

FIG. 34 is a plan view of the substrate 135, and also shows the IGBTs151 and the freewheel diodes 160 placed thereon. The substrate 135 comprises an insulating plate 136 and wiring patterns 137 placed thereon. The insulating plate 136 is fixed on the heat-radiating plate 131 (FIG. 33), and the IGBT151 and the freewheel diode 160 are mounted onto the wiring pattern 137, and electrically connected thereto. In this manner, both of the IGBT151 and the freewheel diode 160 are used in the form of a bear chip.

The collector electrode 8 of each IGBT151 is connected to the cathode electrode of the corresponding freewheel diode 160 through the wiring pattern 137. The emitter electrode 7 of each IGBT151 and the anode electrode of the corresponding freewheel diode 160 are connected to each other through the conductive wire w. Moreover, the emitter electrode 7 of one of the two IGBTs151 constituting a series circuit and the higher potential power-supply terminal PP are connected to each other by the conductive wire w, and the emitter electrode 7 of the other and any one of the three output terminals U, V, W, the collector electrode 8 of the one and any one of the three output terminals U, V, W, and the collector electrode 8 of the other and the lower potential power-supply terminal NN are respectively connected to each other by the wiring pattern 137 and the conductive wire w. Moreover, the respective gate electrodes 5 of the six IGBTs151 and the corresponding gate terminals G are connected to each other by the conductive wires w.

FIG. 35 is an inner perspective view of a semiconductor device that shows another example of an applied apparatus. This semiconductor device 154 comprises a heat-radiating plate 125, an IGBT151 and a freewheel diode 160 that are placed thereon, a collector terminal 121, an emitter terminal 122, a gate terminal 123, conductive wires w and a sealing member 126 that seals all the elements except for the tip portions of the respective three terminals 121, 122, 123. A heat-radiating plate 125, which is made of cupper, and also referred to as a cupper frame, serves as a reinforcing member and a wiring pattern as well.

The collector electrode 8 of the IGBT151 is connected to the cathode electrode of the corresponding freewheel diode 160 and the collector terminal 121 through the heat-radiating plate 125. The emitter electrode 7 of the IGBT151 and the anode electrode of the corresponding freewheel diode 160 are connected to each other by the conductive wire w. Moreover, the emitter electrode 7 of the IGBT151 and the emitter terminal 122 are connected to each other by the conductive wire w, and the gate electrode 5 of the IGBT151 and the gate terminal 123 are also connected to each other by the conductive wire w.

As shown in FIGS. 31 to 33, in the case when an inductive load such as a motor is connected to the conventional IGBT151 (or 151a in the same manner), the freewheel diode 160 has been required so as to bypass a circulating current that forms a reverse current to the IGBT151. An inductive component included in the impedance of the inductive load (for example, represented by an induction L) stores energy in a magnetic field generated by a current. Therefore, a change in the current flowing through the induction L corresponds to a change in the energy to be stored. During the process in which the current flowing through the inductive load is interrupted, the induction L is exerted in such a way as to interrupt the change in current. Energy, accumulated in the induction L, is released to the IGBT151 that serves as a switching element to interrupt the current so that the current flowing through the induction L is attenuated.

The energy accumulated in the induction L is so great that, if released instantaneously, it might easily break the IGBT151. Therefore, during the process in which the IGBT151 is turned off, the current flowing through the inductive load is circulated by bypassing it to the free-wheel diode 160 so that the current flowing through the inductive load is not changed by the switching. In the semiconductor device 152 of FIG. 31, when one of the IGBTs151, which has been turned on to electrically connect the direct-current power supply 20 to the load 21 and supply a power-supply voltage to the load 21, is turned off, the current flowing through the load 21 is made to pass through the freewheel diode 160 and reversely flow through the direct-current power supply 20 by energy stored in the induction L of the load 21. As a result, a direct-current voltage that is reversed equivalently is applied to the load 21.

By changing the ratio between the time in which the IGBT151 is on and the time in which it is off, the ratio between the period in which the power-supply voltage of the direct-current power supply 20 is applied in the forward direction and the period in which it is applied in the reverse direction is changed so that it is possible to control the average voltage to be applied to the load 21. Thus, by allowing this ratio to change in a sine-wave form, it is possible to supply to the load 21 a smooth alternating current without abruptly turning on or off the current flowing through the load 21 in synchronism with switching of the IGBT151.

The inverter such as the semiconductor device 152 carries out the above-described operation so that, as shown in FIGS. 31 to 33, it is necessary to connect the freewheel diode 160 in reverse-parallel to the corresponding IGBT151. A power MOSFET, which has been used as a switching element since before the appearance of the IGBT151, inherently has a structure having a built-in reverse-parallel diode; therefore, it has been not necessary to connect the freewheel diodes 160 thereto in a separated manner. However, the power MOSFET has only a low current density, and is not suitable for the application with a great current.

In contrast, the IGBT, which is suitable for the application with a great current, and has a construction in which an N$^+$ layer of the power MOSFET is replaced with the P$^+$ collector layer 91 so that a parasitic diode is formed between the P$^+$ collector layer 91 on the collector electrode 8 side and the N$^-$ base layers 92, 93. This tends to function as a high barrier with respect to a circulating current. The breakdown voltage of the parasitic diode is approximately 30 to 50 V, and this is an excessively high value so as to use the parasitic diode as a substitute for the reverse-parallel-connected freewheel diode. For this reason, if the freewheel diode 160 is not connected, IGBT151 might be damaged due to heat generated by a reverse voltage generated at the time of the circulation.

As described above, although the conventional IGBTs151, 151a are superior to the power MOSFETs in that the current density is great, they need to be connected to the freewheel diodes 160 when they are applied, and this causes extra costs and makes the structure of a semiconductor device serving as an application device complex, resulting in an increase in the size, an increase in the number of parts used for connections as well as an increase in processing costs.

DISCLOSURE OF INVENTION

The present invention has been devised to solve the above-mentioned problems, and an object thereof is to provide an insulated gate bipolar transistor which can eliminate the necessity of connection to a freewheel diode, a semiconductor device using such a transistor, and manufacturing method thereof.

In order to achieve this object, the first aspect of the present invention is related to an insulated gate bipolar transistor comprising a semiconductor substrate having first and second major surfaces, a collector electrode which is located on said first major surface side of the semiconductor substrate, and an emitter electrode and a gate electrode that are located on said second major surface side, wherein the semiconductor substrate comprises a collector layer of a first conductive type that is exposed to the first major surface and connected to the collector electrode, and a base layer of a second conductive type that is formed on the collector layer and is not exposed to the first major surface, and wherein the base layer and the collector layer have a characteristic as a free-wheel diode.

The second aspect of the present invention, which relates to an insulated gate bipolar transistor in accordance with the first aspect, wherein a reverse voltage resistance, which is a minimum value of a collector-emitter voltage when a reverse current flows between the emitter electrode and the collector electrode, is set to not more than 5 times a collector-emitter saturated voltage.

The third aspect of the present invention, which relates to an insulated gate bipolar transistor in accordance with the second aspect, is designed so that the base layer comprises a base main body portion and a buffer layer that has a higher concentration of impurities than the base main body portion and is interpolated between the collector layer and the base main body portion, and a minimum value of a collector-emitter voltage when an avalanche current flows through a parasitic diode formed by the base layer and the collector layer is equivalent to the reverse voltage resistance.

The fourth aspect of the present invention, which relates to the insulated gate bipolar transistor in accordance with the second aspect, is designed so that the semiconductor substrate further comprises a reverse conductive-type layer of the second conductive type that is formed inside the collector layer so as not to be connected to the base layer, and selectively exposed to the first major surface, and connected to the collector electrode, and a minimum value of a collector-emitter voltage, that causes a punch through in which a depletion layer generated in a PN junction between the base layer and the collector layer reaches the reverse conductive-type layer, is equivalent to the reverse voltage resistance.

The fifth aspect of the present invention, which relates to the insulated gate bipolar transistor in accordance with the fourth aspect, is designed so that the collector layer comprises a low impurity concentration collector layer, and a high impurity concentration collector layer, the low impurity concentration collector layer comprises a portion of the collector layer sandwiched by the base layer and the reverse conductive-type layer, and the high impurity concentration collector layer has a concentration of impurities higher than the low impurity concentration collector layer.

The sixth aspect of the present invention, which relates to the insulated gate bipolar transistor in accordance with the fourth aspect, is designed so that the base layer comprises a base main body portion, and a buffer layer that has a higher concentration in impurities than the base main body portion, and is interpolated between the collector layer and the base main body portion.

The seventh aspect of the present invention, which relates to the insulated gate bipolar transistor in accordance with the second aspect, is designed so that the semiconductor substrate further comprises a reverse conductive-type layer of the second conductive type that is formed inside the collector layer so as not to be connected to the base layer, and selectively exposed to the first major surface and connected to the collector electrode, and a minimum value of a collector-emitter voltage when a parasitic bipolar transistor formed by the base layer, the collector layer and the reverse conductive type layer turns on, is equivalent to the reverse voltage resistance.

The eighth aspect of the present invention, which relates to the insulated gate bipolar transistor in accordance with the seventh aspect, is designed so that the collector layer comprises a low impurity concentration collector layer, and a high impurity concentration collector layer, and the low impurity concentration collector layer comprises a portion of the collector layer sandwiched by the base layer and the reverse conductive-type layer, and the high impurity concentration collector layer has a concentration of impurities higher than the low impurity concentration collector layer.

The ninth aspect of the present invention, which relates to the insulated gate bipolar transistor in accordance with the seventh aspect, is designed so that the base layer comprises a base main body portion, and a buffer layer that has a higher concentration in impurities than the base main body portion, and is interpolated between the collector layer and the base main body portion.

The tenth aspect of the present invention, which relates to the insulated gate bipolar transistor in accordance with the second aspect, is designed so that the reverse voltage resistance is not more than 10 V.

In accordance with the eleventh aspect of the present invention, a semiconductor device comprises the insulated gate bipolar transistor in accordance with the first aspect, a housing in which the insulated gate bipolar transistor is mounted, and three terminals each of which is attached to said housing with its one portion protruding from said housing toward the exterior, and which are electrically connected to said gate electrode, said emitter electrode and said collector electrode of the insulated gate bipolar transistor, respectively.

In accordance with the twelfth aspect of the present invention, the semiconductor device which relates to the eleventh aspect is designed so that the gate electrode, the emitter electrode and the collector electrode are electrically connected to the three terminals through conductive wires, respectively.

The thirteenth aspect of the present invention, which relates to the semiconductor device in accordance with the eleventh aspect, further comprises the insulated gate bipolar transistor serving as a first transistor, three insulated gate bipolar transistors having the same structure as the first transistor and serving as second through fourth transistors, the three-terminals serving as first to third terminals, and five terminals each of which is attached to the housing with one portion thereof protruding from the housing toward the exterior, the five terminals serving as fourth to eighth terminals, wherein the first and second transistors are series-connected, the third and fourth transistors are series-connected, the first terminal is electrically connected to the collector electrodes of the first and third transistors, the second terminal is electrically connected to connecting sections of the first and second transistors, the third terminal is electrically connected to the gate electrode of the first transistor, the fourth terminal is electrically connected to the emitter electrodes of the second and fourth transistors, the fifth terminal is electrically connected to connecting sections of the third and fourth transistors, and the sixth through eighth terminals are electrically connected to the gate electrodes of the second through fourth transistors, respectively.

The fourteenth aspect of the present invention, which relates to the semiconductor device in accordance with the thirteenth aspect, further comprises an inductive load connected to the second terminal and the fifth terminal.

The fifteenth aspect of the present invention, which relates to a semiconductor device, comprises the insulated gate bipolar transistor in accordance with the first aspect, a sealing member that seals the insulated gate bipolar transistor, and three terminals each of which is sealed by the sealing member with one portion thereof protruding from the sealing member toward the exterior, the three terminals electrically connected to the gate electrode, the emitter electrode and the collector electrode of the insulated gate bipolar transistor, respectively.

In accordance with the sixteenth aspect of the present invention, a manufacturing method of an insulated gate bipolar transistor which comprises a semiconductor substrate having first and second major surfaces, a collector electrode that is located on the first major surface side of the semiconductor substrate, and an emitter electrode and a gate electrode that are located on the second major surface side, comprising the steps of: (a) forming the semiconductor substrate so as to provide a collector layer of a first conductive type that is exposed to the first major surface and a base layer of a second conductive type that is formed on the collector layer and is not exposed to the first major surface, and (b) forming the collector electrode on the first major surface so as to be connected to the collector layer, wherein in the step (a), the semiconductor substrate is formed so that the base layer and the collector layer are allowed to have a characteristic as a freewheel diode.

The seventeenth aspect of the present invention, which relates to the manufacturing method of an insulated gate bipolar transistor in accordance with the sixteenth aspect, is designed so that in the step (a), the semiconductor substrate is formed in such a manner that a reverse voltage resistance, which is a minimum value of a collector-emitter voltage when a reverse current flows between the emitter electrode and the collector electrode, is set to not more than 5 times the collector-emitter saturated voltage.

The eighteenth aspect of the present invention, which relates to the manufacturing method of an insulated gate bipolar transistor in accordance with the seventeenth aspect, is designed so that in the step (a), the base layer comprises a base main body portion and a buffer layer that has a higher concentration in impurities than the base main body portion and is interpolated between the collector layer and the base main body portion, and the semiconductor substrate is formed so that a minimum value of a collector-emitter voltage when an avalanche current flows through a parasitic diode formed by the base layer and the collector layer is equivalent to the reverse voltage resistance.

The nineteenth aspect of the present invention, which relates to the manufacturing method of an insulated gate bipolar transistor in accordance with the seventeenth aspect, is designed so that in the step (a), the semiconductor substrate further comprises a reverse conductive-type layer of the second conductive type that is formed inside the collector layer so as not to be connected to the base layer, and selectively exposed to the first major surface, and connected to the collector electrode, and the semiconductor substrate is formed so that a minimum value of a collector-emitter voltage that causes a punch through in which a depletion layer generated in a PN junction between the base layer and the collector layer reaches the reverse conductive-type layer is equivalent to the reverse voltage resistance.

The twentieth aspect of the present invention, which relates to the manufacturing method of the insulated gate bipolar transistor in accordance with the nineteenth aspect, is designed so that in the above-mentioned step (a), the collector layer comprises a low impurity concentration collector layer and a high impurity concentration collector layer, and in the semiconductor substrate thus formed, the low impurity concentration collector layer includes a portion of the collector layer sandwiched by the base layer and the reverse conductive-type layer, and the high impurity concentration collector layer has a concentration of impurities higher than the low impurity concentration collector layer.

The twenty-first aspect of the present invention, which relates to the manufacturing method of the insulated gate bipolar transistor in accordance with the nineteenth aspect, is designed so that in the step (a), the semiconductor substrate is formed in such a manner that the base layer comprises a base main body portion and a buffer layer that has a higher concentration in impurities than the base main body portion, and is interpolated between the collector layer and the base main body portion.

The twenty-second aspect of the present invention, which relates to the manufacturing method of an insulated gate bipolar transistor in accordance with the seventeenth aspect, is designed so that in the step (a), the semiconductor substrate further comprises a reverse conductive-type layer of the second conductive type that is formed inside the collector layer so as not to be connected to the base layer, and selectively exposed to the first major surface, and connected to the collector electrode, and the semiconductor substrate is formed so that a minimum value of a collector-emitter voltage when a parasitic bipolar transistor formed by the base layer, the collector layer and the reverse conductive type layer turns on is equivalent to the reverse voltage resistance.

The twenty-third aspect of the present invention, which relates to the manufacturing method of the insulated gate bipolar transistor in accordance with the twenty-second aspect, is designed so that in the step (a), the semiconductor substrate is formed in such a manner that the collector layer comprises a low impurity concentration collector layer and a high impurity concentration collector layer, and in this structure, the low impurity concentration collector layer includes a portion of the collector layer sandwiched by the base layer and the reverse conductive-type layer, and the high impurity concentration collector layer has a concentration of impurities higher than the low impurity concentration collector layer.

The twenty-fourth aspect of the present invention, which relates to the manufacturing method of the insulated gate bipolar transistor in accordance with the twenty-second aspect, is designed so that in the step (a), the semiconductor substrate is formed in such a manner that the base layer comprises a base main body portion and a buffer layer that has a higher concentration in impurities than the base main body portion, and is interpolated between the collector layer and the base main body portion.

The twenty-fifth aspect of the present invention, which relates to the manufacturing method of the insulated gate bipolar transistor in accordance with the seventeenth aspect, is designed so that in the step (a), the semiconductor substrate is formed in such a manner that the reverse voltage resistance is set to not more than 10 V.

In the twenty-sixth aspect of the present invention, a manufacturing method of a semiconductor device comprises the steps of: (A) obtaining a housing having three terminals each of which is attached thereto with its one portion protruding toward the exterior, (B) executing the manufacturing method of the insulated gate bipolar transistor according to claim 16 to thereby obtain the insulated gate bipolar transistor, (C) mounting the insulated gate bipolar transistor in the housing, and (D) electrically connecting the three terminals to the gate electrode, the emitter electrode and the collector electrode of the insulated gate bipolar transistor, respectively.

In the twenty-seventh aspect of the present invention that relates to the manufacturing method of the semiconductor device in accordance with the twenty-sixth aspect, the step (D) further comprises a step (D-1) of electrically connecting the gate electrode, the emitter electrode and the collector electrode to the three terminals respectively through conductive wires.

In the twenty-eighth aspect of the present invention that relates to the manufacturing method of the semiconductor device in accordance with the twenty-sixth aspect, the step (A) is arranged so that the housing is obtained with the three-terminals serving as the first to third terminals, and allowed to further include five terminals each of which is attached thereto with its one portion externally sticking out as the fourth through eighth terminals; the step (B) is arranged so that the insulated gate bipolar transistor is obtained as the first transistor with three insulated gate bipolar transistors having the same structure as the first transistor being obtained as the second through fourth transistors; the step (C) is arranged so that, in addition to the first transistor, the second through fourth transistors are mounted in the housing; and the step (D) further comprises the steps of: (D1) connecting the first and second transistors in series with each other; (D2) connecting the third and fourth transistors in series with each other; (D3) electrically connecting the first terminal to the collector electrodes of the first and third transistors; (D4) electrically connecting the second terminal to the connecting sections of the first and second transistors; (D5) electrically connecting the third terminal to the gate electrode of the first transistor; (D6) electrically connecting the fourth terminal to the emitter electrodes of the second and fourth transistors; (D7) electrically connecting the fifth terminal to the connecting sections of the third and fourth transistors; and (D8) electrically connecting the six through eighth terminals to the gate electrodes of the second through fourth transistors.

In the twenty-ninth aspect of the present invention, the manufacturing method of the semiconductor device in accordance with the twenty-eighth aspect further comprises a step of (E) connecting an inductive load to the second terminal and the fifth terminal.

In the thirtieth aspect of the present invention, a manufacturing method of a semiconductor device comprises the steps of: (A) obtaining three terminals, (B) executing the manufacturing method of the insulated gate bipolar transistor according to claim 16 to thereby obtain the insulated gate bipolar transistor, (C) electrically connecting the three terminals to the gate electrode, the emitter electrode and the collector electrode of the insulated gate bipolar transistor, respectively, and (D) sealing the insulated gate bipolar transistor and the three terminals in such a manner that one portion of each of the three terminals is allowed to protrude toward the exterior.

The present invention, which has the arrangements as described above, makes it possible to provide the following effects.

In accordance with the insulated gate bipolar transistor related to the first aspect of the present invention, since the base layer and the collector layer have the characteristic of the freewheel diode, it is not necessary to externally connect the freewheel diode upon application thereof.

In accordance with the insulated gate bipolar transistor related to the second aspect of the present invention, since the reverse voltage resistance is reduced to not more than 5 times the collector-emitter saturated voltage, the circulating current is allowed to flow through itself without the necessity of any special heat-radiating design even when an inductive load is connected thereto.

In accordance with the insulated gate bipolar transistor related to the third aspect of the present invention, since the reverse voltage resistance is determined by the avalanche breakdown of the parasitic diode, it is possible to easily suppress the collector-emitter saturated voltage to a low level by increasing the concentration of impurities of the collector layer. Moreover, since the buffer layer is installed, it is possible to make the base layer thinner, and consequently to further reduce both of the collector-emitter saturated voltage and the reverse voltage resistance.

In accordance with the insulated gate bipolar transistor related to the fourth aspect of the present invention, since the reverse conductive-type layer is formed inside the collector layer, the reverse voltage resistance is determined by a punch through voltage, and it becomes possible to set the reverse voltage resistance to a low level.

In accordance with the insulated gate bipolar transistor related to the fifth aspect of the present invention, since the collector layer comprises the high impurity concentration collector layer, it becomes possible to suppress the collector-emitter saturated voltage to a low level by compensating for the reduction in the amount of injection of holes due to the installed reverse conductive-type layer.

In accordance with the insulated gate bipolar transistor related to the sixth aspect of the present invention, since the buffer layer is installed, it is possible to make the base layer thinner, and consequently to further reduce both of the collector-emitter saturated voltage and the reverse voltage resistance.

In accordance with the insulated gate bipolar transistor related to the seventh aspect of the present invention, since the reverse conductive-type layer is formed inside the collector layer, the reverse voltage resistance is determined by a turning-on of the parasitic bipolar transistor so that it becomes possible to easily set the reverse voltage resistance to a low level.

In accordance with the insulated gate bipolar transistor related to the eighth aspect of the present invention, since the collector layer comprises the high impurity concentration collector layer, it becomes possible to suppress the collector-emitter saturated voltage to a low level by compensating for the reduction in the amount of injection of holes due to the installed reverse conductive-type layer.

In accordance with the insulated gate bipolar transistor related to the ninth aspect of the present invention, since the buffer layer is installed, it is possible to make the base layer thinner, and consequently to further reduce both of the collector-emitter saturated voltage and the reverse voltage resistance.

In accordance with the insulated gate bipolar transistor related to the tenth aspect of the present invention, since the reverse voltage resistance is set to not more than 10 V, it is possible to reduce the amount of heat generation due to the reverse current to a low level, even in the case of a collector-emitter saturated voltage exceeding 2 V.

In accordance with a semiconductor device related to the eleventh aspect of the present invention, since the insulated gate bipolar transistor is mounted in a housing, it is possible to provide a convenient means in which the insulated gate bipolar transistor is connected to a power supply and a load and utilized. Moreover, since the insulated gate bipolar transistor in accordance with the first aspect of the present invention that requires no freewheel diodes is utilized, it is possible to miniaturize the device, and also to cut manufacturing costs.

In accordance with the semiconductor device related to the twelfth aspect of the present invention, since each electrode of the insulated gate bipolar transistor and each terminal are electrically connected through the conductive wire, it is possible to simplify the manufacturing process, and consequently to further reduce the manufacturing cost. In particular, since no freewheel diodes are required, it is possible to reduce the number of conductive wires and the number of connecting processes.

In accordance with the semiconductor device related to the thirteenth aspect of the present invention, since the insulated gate bipolar transistor in accordance with the first aspect of the present invention that requires no freewheel diodes is utilized, it is possible to achieve a small-size inverter that is inexpensive and easily used.

In accordance with the semiconductor device related to the fourteenth aspect of the present invention, since an inductive load is connected, it is possible to drive the inductive load by only connecting a direct current supply and a control circuit.

In accordance with the semiconductor device related to the fifteenth aspect of the present invention, since the insulated gate bipolar transistor is sealed by the sealing member, it is possible to provide a convenient means in which the insulated gate bipolar transistor is connected to a power supply and a load and utilized. Moreover, since the insulated gate bipolar transistor in accordance with the first aspect of the present invention that requires no freewheel diodes is utilized, it is possible to miniaturize the device, and also to cut manufacturing costs.

In accordance with the manufacturing method of the insulated gate bipolar transistor related to the sixteenth aspect of the present invention, since the base layer and collector layer are allowed to have the characteristic as the freewheel diode, it is possible to obtain the insulated gate bipolar transistor that requires no externally connected freewheel diode upon application thereof.

In accordance with the manufacturing method of the insulated gate bipolar transistor related to the seventeenth aspect of the present invention, since the reverse voltage resistance is reduced to not more than 5 times the collector-emitter saturated voltage, it is possible to provide the insulated gate bipolar transistor in which the circulating current is allowed to flow through itself without the necessity of any special heat-radiating design even when an inductive load is connected thereto.

In accordance with the manufacturing method of the insulated gate bipolar transistor related to the eighteenth aspect of the present invention, since the semiconductor substrate is formed so that the reverse voltage resistance is determined by the avalanche breakdown of the parasitic diode, it is possible to easily suppress the collector-emitter saturated voltage to a low level by increasing the concentration of impurities of the collector layer. Moreover, since the buffer layer is installed, it is possible to make the base layer thinner, and consequently to further reduce both of the collector-emitter saturated voltage and the reverse voltage resistance.

In accordance with the manufacturing method of the insulated gate bipolar transistor related to the nineteenth aspect of the present invention, since the semiconductor substrate is formed so that the reverse conductive-type layer is formed inside the collector layer and the reverse voltage resistance is consequently determined by a punch through voltage, it becomes possible to set the reverse voltage resistance to a low level.

In accordance with the manufacturing method of the insulated gate bipolar transistor related to the twentieth aspect of the present invention, since the semiconductor substrate is formed so that the collector layer comprises the high impurity concentration collector layer, it becomes possible to suppress the collector-emitter saturated voltage to a low level by compensating for the reduction in the amount of injection of holes due to the installed reverse conductive-type layer.

In accordance with the manufacturing method of the insulated gate bipolar transistor related to the twenty-first aspect of the present invention, since the buffer layer is installed, it is possible to make the base layer thinner, and consequently to further reduce both of the collector-emitter saturated voltage and the reverse voltage resistance.

In accordance with the manufacturing method of the insulated gate bipolar transistor related to the twenty-second aspect of the present invention, since the semiconductor substrate is formed so that the reverse conductive-type layer is formed inside the collector layer with the reverse voltage resistance being determined by a turning-on of the parasitic bipolar transistor, it becomes possible to easily set the reverse voltage resistance to a low level.

In accordance with the manufacturing method of the insulated gate bipolar transistor related to the twenty-third aspect of the present invention, since the semiconductor substrate is formed so that the collector layer has the high impurity concentration collector layer, it becomes possible to suppress the collector-emitter saturated voltage to a low level by compensating for the reduction in the amount of injection of holes due to the installed reverse conductive-type layer.

In accordance with the manufacturing method of the insulated gate bipolar transistor related to the twenty-fourth aspect of the present invention, since the buffer layer is installed, it is possible to make the base layer thinner, and consequently to further reduce both of the collector-emitter saturated voltage and the reverse voltage resistance.

In accordance with the manufacturing method of the insulated gate bipolar transistor related to the twenty-fifth aspect of the present invention, since the reverse voltage resistance is set to not more than 10 V, it is possible to reduce the amount of heat generation due to the circulating current to a low level, even in the case of the collector-emitter saturated voltage exceeding 2 V.

In accordance with the manufacturing method of the semiconductor device related to the twenty-sixth aspect of the present invention, since the insulated gate bipolar transistor is mounted in the housing, it is possible to provide the convenient means in which the insulated gate bipolar transistor is connected to a power supply and a load and utilized. Moreover, since the insulated gate bipolar transistor in accordance with the first aspect of the present invention that requires no freewheel diodes is utilized, it is possible to miniaturize the device, and also to cut manufacturing costs.

In accordance with the manufacturing method of a semiconductor device related to the twenty-seventh aspect of the present invention, since each electrode of the insulated gate bipolar transistor and each terminal are electrically connected through the conductive wire, it is possible to simplify the manufacturing process, and consequently to further reduce the manufacturing cost. In particular, since no freewheel diodes are required, it is possible to reduce the number of conductive wires and the number of connecting processes.

In accordance with the manufacturing method of the semiconductor device related to the twenty-eighth aspect of the present invention, since the insulated gate bipolar transistor in accordance with the first aspect of the present invention that requires no freewheel diodes is utilized, it is possible to achieve a small-size inverter that is inexpensive and easily used.

In accordance with the manufacturing method of a semiconductor device related to the twenty-ninth aspect of the present invention, since the inductive load is connected, it is possible to provide the semiconductor device that can drive the inductive load by only connecting a direct current supply and a control circuit.

In accordance with the manufacturing method of the semiconductor device related to the thirtieth aspect of the present invention, since the insulated gate bipolar transistor is sealed by the sealing member, it is possible to provide the convenient semiconductor device in which the insulated gate bipolar transistor is connected to a power supply and a load, and utilized. Moreover, since the insulated gate bipolar transistor in accordance with the first aspect of the present invention that requires no freewheel diodes is utilized, it is possible to miniaturize the device, and also to cut manufacturing costs.

These and other objects, features, aspects and advantages of the present invention will become more apparent from the following detailed description of the present invention when taken in conjunction with the accompanying drawings.

BRIEF DESCRIPTION OF DRAWINGS

FIGS. 3 and 4 are descriptive drawings that show the construction of the IGBT in accordance with the first preferred embodiment.

FIGS. 26, 27 and 28 are drawings that show processes in a manufacturing method of the semiconductor device in accordance with the sixth preferred embodiment.

FIG. 33 is a cross-sectional view of another example of semiconductor device in accordance with the conventional technique.

FIG. 34 is a plan view that shows another example of substrate in accordance with the conventional technique.

FIG. 35 is a perspective view that shows still another example of semiconductor device in accordance with the conventional technique.

BEST MODE FOR CARRYING OUT THE INVENTION

1. First Preferred Embodiment (Outline of a Device Construction)

Figure 1:
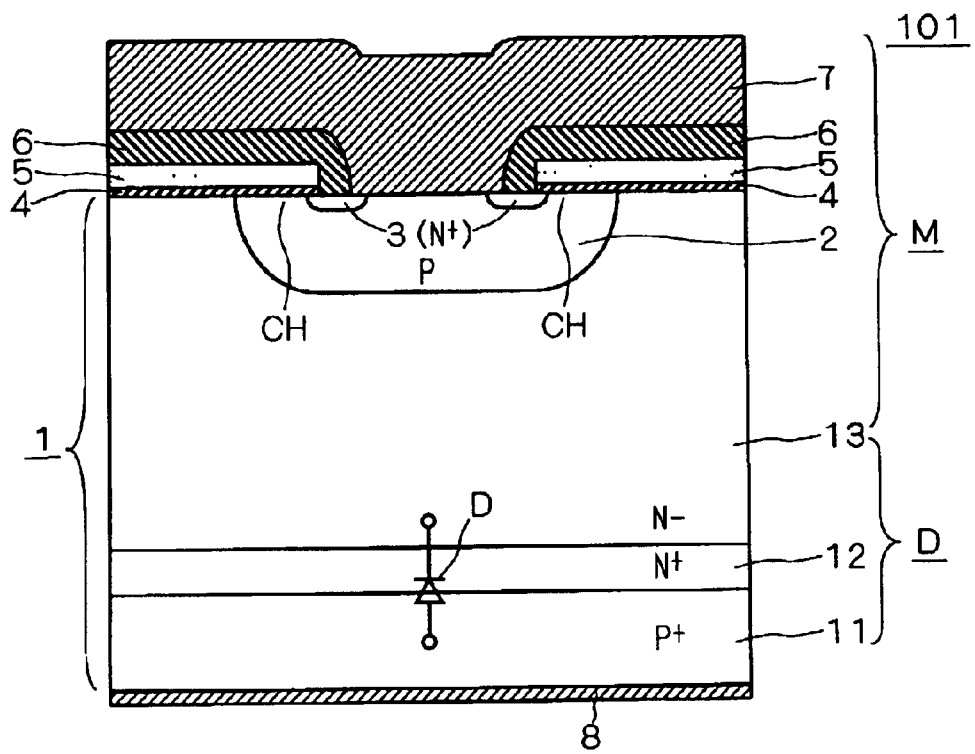
FIG. 1 is a front cross-sectional view of an IGBT in accordance with a first preferred embodiment.
Figure 29:
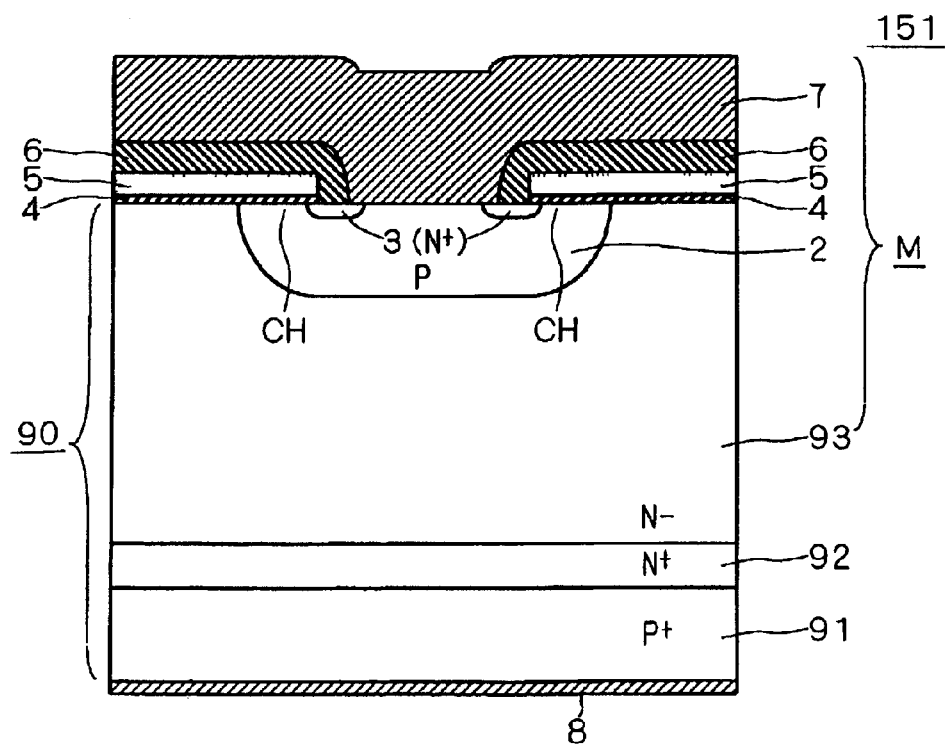
FIG. 29 is a front cross-sectional view of an IGBT in accordance with a conventional technique.

FIG. 1 is a front cross-sectional view of an IGBT in accordance with a first preferred embodiment of the present invention. This IGBT101 comprises a semiconductor substrate 1 having first and second major surfaces. This semiconductor substrate 1, which is a silicon substrate, comprises a P$^+$ collector layer 11 that is a P$^+$ substrate that is exposed to the first major surface, an N$^+$ buffer layer 12 formed thereon, an N$^-$ base layer 13 that is formed thereon with a lower concentration of impurities than the N$^+$ buffer layer 12, a P base region 2 that is formed by selectively diffusing P-type impurities on the second major surface to which the N$^-$ base layer 13 is exposed, and an N$^+$ source region 3 that is formed as a region shallower than the P base region 2 by selectively diffusing N-type impurities with a high concentration inside this P base region 2. Here, in the N$^+$ buffer layer 12, the concentration of the N-type impurities is set higher than that of the N$^+$ buffer layer 92 of the conventional IGBT151 (see FIG. 29).

A gate insulating film 4, made of a silicon dioxide, is formed on the second major surface of the semiconductor substrate 1 in a manner so as to cover one portion of a surface of the P base region 2 and a surface of the N$^-$ base layer 13. A gate electrode 5, made of polysilicon, is formed on the gate insulating film 4. An emitter electrode 7 is further formed on the upper major surface of the semiconductor substrate 1 in a manner so as to connect with one portion of the surface of the N$^+$ source region 3 and a center area of the surface of the P base region 2. The gate electrode 5 and the emitter electrode 7 are insulated from each other by an interlayer insulating film 6.

Therefore, the N$^-$ base layer 13, the P base region 2 and the N$^+$ source region 3, which are formed on the second major surface side of the semiconductor substrate 1, correspond to a semiconductor portion of an MOS transistor. In the same manner as the IGBT151, 151a, the portion having the same construction as the MOS transistor formed on the second major surface side of the semiconductor substrate 1 is referred to as an MOS construction M. A portion of the surface of the P base region 2, which is located right below the gate electrode 5, and sandwiched by the source region 3 and the N$^-$ base layer 13, that is, a portion at which the gate electrodes 5 face each other with the gate insulating film 4 sandwiched in between, corresponds to a channel region CH of the MOS structure M. The P base region 2 and the N$^+$ source region 3 are formed by selectively implanting and diffusing impurities by using the gate electrode 5 as a mask. That is, since the P base region 2 and the N$^+$ source region 3 form a double diffusion region, the MOS structure M forms one example of Double Diffused MOS (referred to simply as a DMOS). A collector electrode 8 to be connected to the P$^+$ collector layer 11 is formed on the first major surface of the semiconductor substrate 1.

Figure 2:
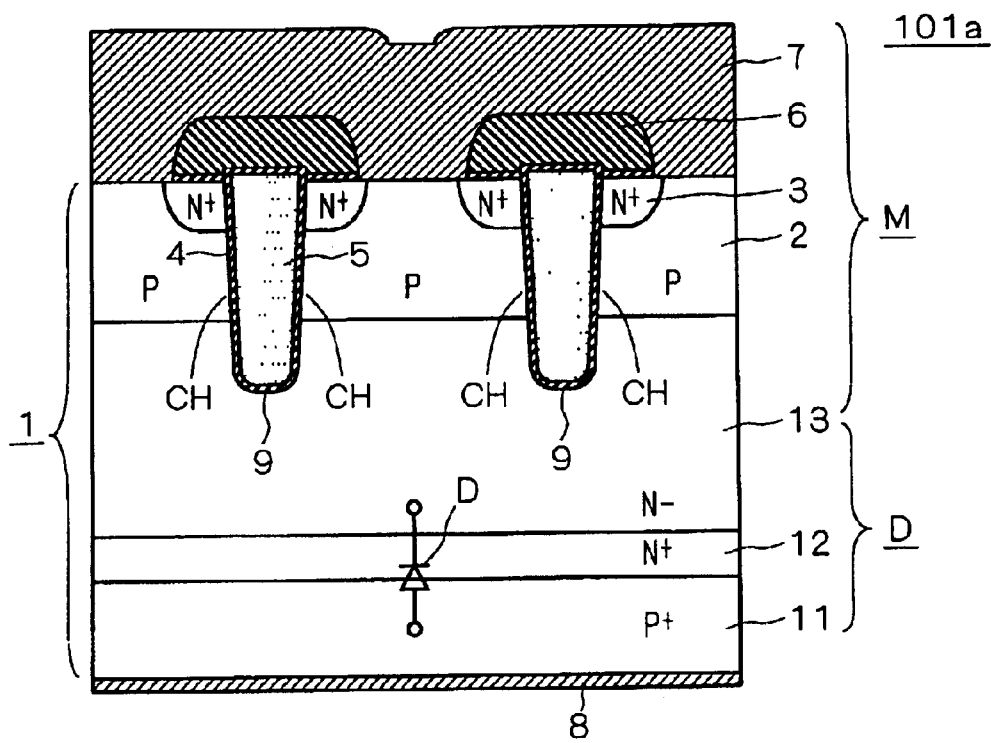
FIG. 2 is a front cross-sectional view of another example of IGBT in accordance with the first preferred embodiment.
Figure 30:
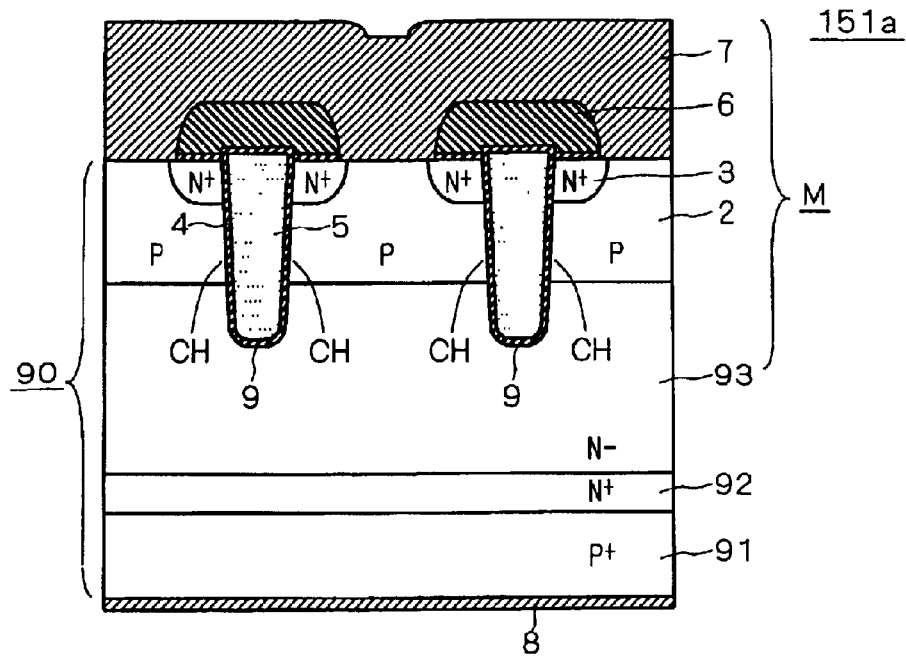
FIG. 30 is a front cross-sectional view of another example of IGBT in accordance with the conventional technique.

FIG. 2 is a front cross-sectional view of an insulated gate bipolar transistor in accordance with another example of the first preferred embodiment. This IGBT101a is typically different from the IGBT101 in its MOS structure M formed on the second major surface side of the semiconductor substrate 1. A trench 9, which penetrates an N$^+$ source region 3 and a P base region 2 to reach an N$^-$ base layer 13, is formed on the second major surface, and a gate insulating film 4 is formed in a manner so as to cover the inner wall surface thereof. Moreover, a gate electrode 5 is buried inside the gate insulating film 4. In this IGBT101a also, a portion of a surface of the P base region 2 (which includes a surface exposed to the trench 9), which is sandwiched by the N$^+$ source region 3 and the N$^-$ base layer 13, that is, a portion at which the gate electrodes 5 face each other with the gate insulating film 4 sandwiched in between, corresponds to a channel region CH of the MOS transistor. In the same manner as the IGBT101, an N$^+$ buffer layer 12 is set to have a higher concentration in N-type impurities than that of the N$^+$ buffer layer 92 of the conventional IGBT151a (FIG. 30).

In this manner, each of the planar IGBT101 of FIG. 1 and the trench-type IGBT101a of FIG. 2 comprises a P$^+$ collector layer 11 that is exposed to the first major surface of the semiconductor substrate 1, the N base layers 12, 13 formed thereon, the MOS structure M (including one portion of the N$^-$ base layer 13) formed on the second major surface and a collector electrode 8 that is formed on the first major surface and connected to the P$^+$ collector layer 11. A number of cells, shown in FIG. 1 or 2, are reciprocally arranged along the major surfaces of the semiconductor substrate 1 so that a greater current rate is obtained by this arrangement. In FIG. 1, one cell is drawn, and in FIG. 2, two cells are drawn.

(Outline of the Operation of the Device)

Next, the operations of IGBT101 and 101a will be described. In the structures of FIGS. 1 and 2, with a predetermined collector-emitter voltage (referred to as a collector voltage) $V_{CE}$ being applied between the emitter electrode 7 and the collector electrode 8, a gate-emitter voltage (referred to as a gate voltage) $V_{GE}$ with a positive bias having a predetermined level is applied between the emitter electrode 7 and the gate electrode 5; that is, upon turning on the gate, a conductive type of the channel region CH is inverted from a P type to an N type. As a result, a channel serving as a carrier path is formed in the channel region CH. Electrons are injected from the emitter electrode 7 to the N⁻ base layer through this channel. The electrons thus injected make the P⁺ collector layer 11 and the N base layers 12, 13 forwardly biased so that holes are injected to the N base layers 12, 13 from the P⁺ collector layer 11. As a result, the resistance of N⁻ base layer 12 drops greatly so that the current capacity of IGBT101, 101a is increased.

Next, when the gate voltage $V_{GE}$ is set from a positive bias value to 0 or a reverse bias value, that is, when the gate is turned off, the channel region CH, inverted to the N type, is restored to the P type. Consequently, the injection of electrons from the emitter electrode 7 is stopped. The stop of injection of electrons also stops the injection of holes from the P⁺ collector layer 11. Thereafter, electrons and holes, accumulated in the N base layers 12, 13, are either drawn into the collector electrode 8 and the emitter electrode 7, respectively, or recombined with each other to disappear.

(Featured Construction and Featured Operation of the Device)

When the IGBT101, 101a are in an off state, a collector voltage $V_{CE}$, which is applied between the emitter electrode 7 and the collector electrode 8, is determined by a thickness of the N⁻ base layer 13 and its concentration of impurities. Moreover, in the IGBTs101, 101a, a parasitic diode D is formed in an equivalent manner by the N base layers 12, 13 and the P⁺ collector layer 11. In the N⁺ buffer layer 12, the concentration of N-type impurities is set sufficiently higher than the N⁺ buffer layer 92 of the conventional IGBT151, 151a; therefore, the breakdown voltage of parasitic diode D, which is determined by the P⁺ layer 11 and the N⁺ buffer layer 12, is suppressed to a low level. This breakdown voltage determines the reverse voltage resistance of IGBTs101, 101a. When the reverse voltage applied between the emitter electrode 7 and the collector electrode 8 exceeds the reverse voltage resistance, a reverse current flows from the emitter electrode 7 to the collector electrode 8.

Figure 5:
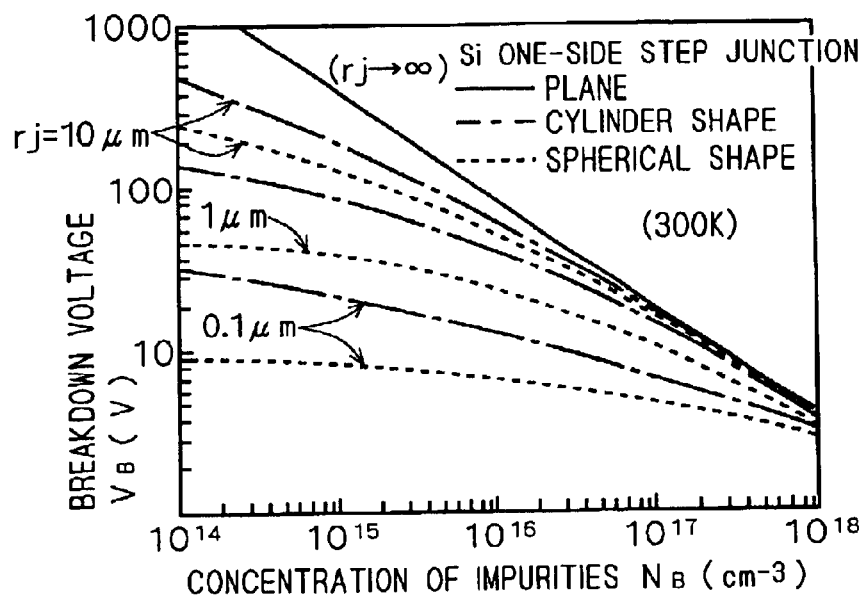
FIG. 5 is a graph that describes the construction of the IGBT in accordance with the first preferred embodiment.

FIGS. 3 to 5 are drawings quoted from page 105 of "Semiconductor Device" written by S. M. Sze (published by "Sangyo Tosho", in 1987)(translation of S. M. Sze, "Semiconductor Devices-Physics and Technology-", published by Bell Telephone Laboratories, Inc. 1985). FIG. 3 shows a curved surface of a PN junction that is generated at the end portion of a diffusion mask in a planar diffusion process, and a symbol $r_j$ represents a curvature radius of the curved surface. FIG. 4 shows a diffusion region that is formed by using a diffusion mask having a rectangular shape, a symbol PL represents a plane region, a symbol CY represents a cylinder shaped region, and a symbol SP represents a spherical region. FIG. 3 corresponds to a longitudinal cross-sectional view showing the diffusion region of FIG. 4. FIG. 5 represents the relation between the breakdown voltage $V_B$ and the concentration of impurities $N_B$ in the PN junction shown in FIGS. 3 and 4. The breakdown voltage $V_B$ means a reverse voltage that causes an avalanche breakdown in the PN junction.

The graph of FIG. 5 shows that it is possible to reduce the breakdown voltage between the N⁺ buffer layer 12 and the P⁺ collector layer 11 to not more than 10 V, by adjusting the concentration of impurities of N⁺ buffer layer 12 (so as to set to not less than 5×10¹⁷ cm⁻³). A power factor of a normal inductive load such as a motor is set to a high level such as not less than 0.8; therefore, in a normal inverter that is connected to such an inductive load, and used, the average value of currents flowing through the IGBT in a forward direction becomes not less than 5 times the average value of the circulating current. Therefore, if the reverse voltage resistance of the IGBT is set to a voltage of not more than 5 times a voltage between the collector electrode 8 and the emitter electrode 7 at the time when the IGBT is on, that is, no more than 5 times a collector-emitter saturated voltage $V_{CE\,(sat)}$, it becomes possible to allow the circulating current to pass through the IGBT itself as a reverse current without causing a damage due to heat generation, even when a freewheel diode is not connected to the IGBT and the heat radiating structure of the conventional IGBT, as it is, is adopted. The collector-emitter saturated voltage $V_{CE\,(sat)}$ is approximately 2 V; therefore, if the reverse voltage resistance of the IGBT can be set to not more than 10 V, it becomes possible to use the IGBT as a switching element in an inverter without the necessity of freewheel diode.

The graph of FIG. 5 shows that the IGBTs101, 101a can be designed as the IGBT that is applicable without using the freewheel diode, by setting the concentration of impurities in the N⁺ buffer layer 12 to a sufficiently high value. The IGBTs101, 101a having such an arrangement are allowed to function in a manner equivalent to IGBTs151, 151a in which freewheel diodes, each having a forward voltage $V_F$ of not more than 10 V, are connected in reverse-parallel with each other.

(Manufacturing Method of the Device)

Figure 6:
FIGS. 6 and 7 are drawings that show manufacturing processes in a manufacturing method of the IGBT in accordance with the first preferred embodiment.
Figure 7:
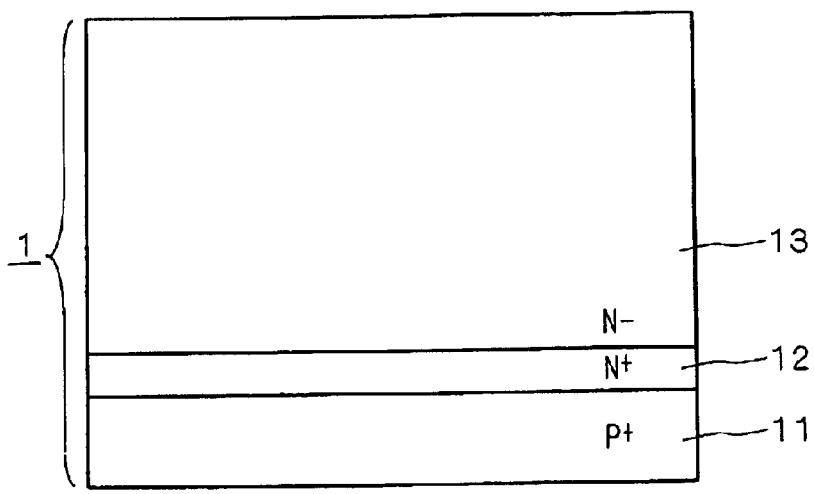

FIGS. 6 and 7 are manufacturing process drawings that show one example of a manufacturing method of the IGBT101, 101a. In this example, first, a silicon substrate 11 of a P⁺ type is prepared (FIG. 6). Next, an N⁺ buffer layer 12 and an N⁻ base layer 13 are formed in this order (FIG. 7) on a major surface of the silicon substrate 11. The N⁺ buffer layer 12 and the N⁻ base layer 13 may be formed by implanting and diffusing impurities or by utilizing the epitaxial growth. A portion of the silicon substrate 11 that is left as a P⁺ type semiconductor layer after the N⁺ buffer layer 12 and the N⁻ base layer 13 have been formed corresponds to the P⁺ collector layer 11.

In the case when the epitaxial growth is utilized in both of the formation processes of the N⁺ buffer layer 12 and the N⁻ base layer 13, the silicon substrate 11, as it is, forms the P⁺ collector layer 11. In the case of the application of implantation and diffusion of impurities also, the major portion of silicon substrate 11 forms the P⁺ collector layer 11. Therefore, the silicon substrate 11 is represented by the same reference number as the P⁺ collector layer 11.

Next, after the MOS structure M including one portion of the N⁻ base layer 13 has been formed on the second major surface of the semiconductor substrate 1, the collector electrode 8 is formed on the first major surface of the semiconductor substrate 1 to which the P⁺ collector layer 11 is exposed (FIG. 1 or FIG. 2). Since the processes for forming the MOS structure M have been conventionally known, the detailed description thereof is omitted. In the processes for forming the semiconductor substrate 1, the shape (including the size) of respective semiconductor layers and the concentration of impurities are controlled so that the reverse voltage resistance of each of the IGBTs101, 101a is set to not more than 5 times the collector-emitter saturated voltage $V_{CE(sat)}$, more preferably, not more than 10 V. In particular, the concentration of impurities of the N$^+$ buffer layer 12 is adjusted. After the above-mentioned processes, the IGBTs101, 101a have been completed.

Figure 8:
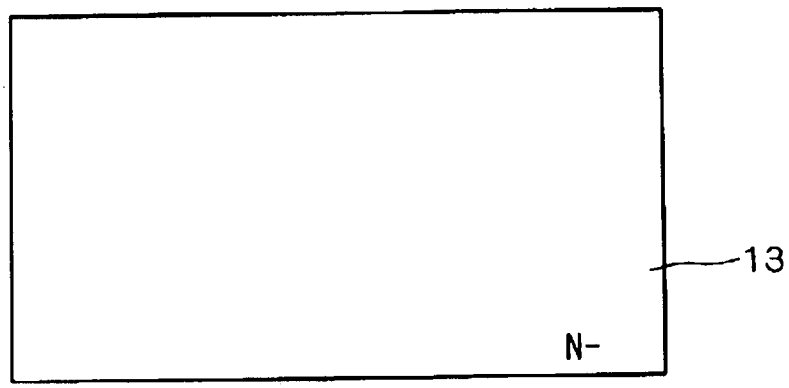
FIG. 8 is a drawing that shows a manufacturing process in another manufacturing method of the IGBT in accordance with the first preferred embodiment.

FIG. 8 is a manufacturing process drawing that shows another example of a method for manufacturing the IGBTs101, 101a. In this example, first an N$^-$ type silicon substrate 13 is prepared. Next, an N$^+$ buffer layer 12 and a P$^+$ collector layer 11 are formed in this order on a major surface of the silicon substrate 13 to form the same structure as that of FIG. 7. The N$^+$ buffer layer 12 and the P$^+$ collector layer 11 may be formed by implanting and diffusing impurities or utilizing the epitaxial growth. Thereafter, the above-mentioned processes for forming the MOS structure M and the collector electrode 8, which have been described by reference to FIG. 1 or FIG. 2, are carried out to form the IGBTs101, 101a.

A portion of the silicon substrate 13 that is left as an N$^-$ type semiconductor layer, after the N$^+$ buffer layer 12, the P$^+$ collector layer 11, the P base region 2 and the N$^+$ source region 3 have been formed, corresponds to the N$^-$ base layer 13. Since the N$^-$ base layer 13 corresponds to the major portion of the silicon substrate 13, the silicon substrate 13 is represented by the same reference number as the N$^-$ base layer 13.

The above-mentioned processes are the same as those manufacturing processes of the conventional IGBTs151, 151a, except that the shape of the respective semiconductor layers and the concentration of impurities are controlled so that the reverse voltage resistance of each of the IGBTs101, 101a is set to not more than 5 times the collector-emitter saturated voltage $V_{CE(sat)}$. That is, the IGBTs101, 101a can be manufactured without the necessity of any special complex processes in comparison with the conventional IGBTs151, 151a.

2. Second Preferred Embodiment

Figure 9:
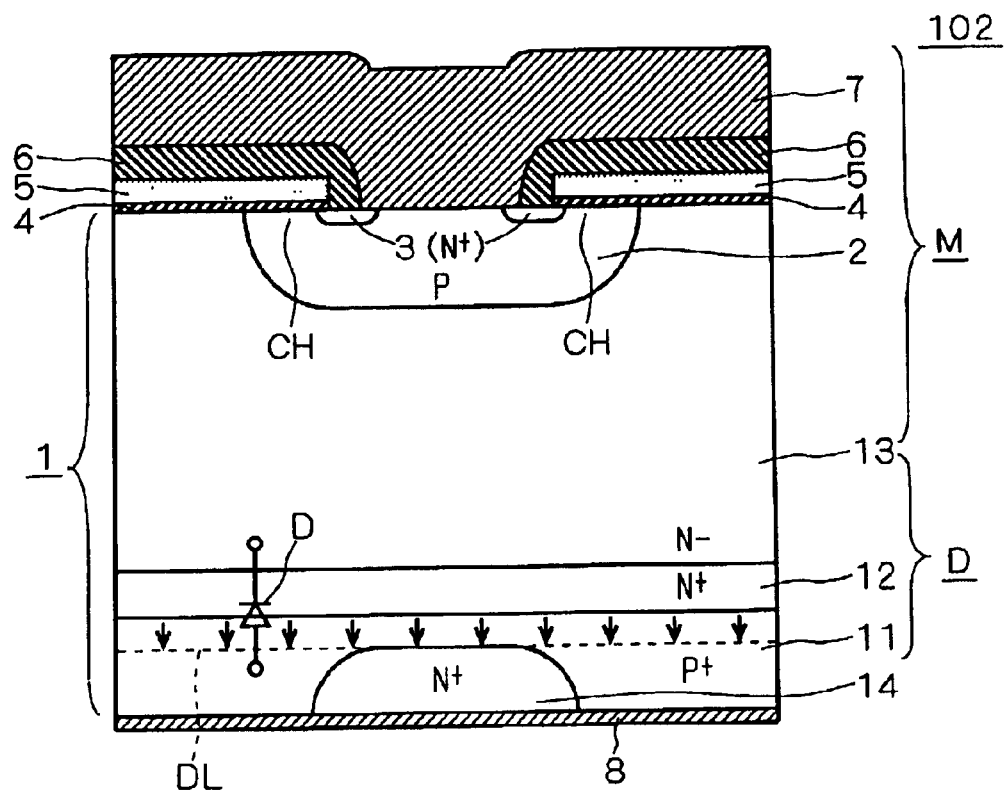
FIG. 9 is a front cross-sectional view of an IGBT in accordance with a second preferred embodiment.

FIG. 9 is a front cross-sectional view that shows an IGBT in accordance with a second preferred embodiment of the present invention. In the following drawings, those parts that are the same as or correspond to (those parts having the same functions as) those of the device in accordance with the first preferred embodiment shown in FIG. 1 and FIG. 2 are represented by the same reference numbers, and the description thereof is omitted. Here, an IGBT102, shown in FIG. 9, is typically distinct from the IGBT101 of FIG. 1 in that the semiconductor substrate 1 comprises an N$^+$ reverse conductive-type layer 14 (for example, referred to as a reverse conductive-type layer, since it has a conductive type reversed to the P$^+$ collector layer 11 on the periphery thereof). The N$^+$ reverse conductive-type layer 14 is selectively exposed to the first major surface of the semiconductor substrate 1, and formed inside the P$^+$ collector layer 11 so as to be shallower than the P$^+$ collector layer 11. Therefore, the N$^+$ reverse conductive-type layer 14 and the N base layers 12, 13 are separated from each other by the P$^+$ collector layer 11.

When a reverse voltage is applied between the collector electrode 8 and the emitter electrode 7, a depletion layer DL is generated at a PN junction of the parasitic diode D. A thickness of the P$^+$ collector layer 11 (in particular, a thickness of a portion making the N$^+$ reverse conductive-type layer 14 and the N$^+$ buffer layer 12 separate from each other) and the concentration of impurities are adjusted so that, when this reverse voltage is not more than 5 times (more preferably, not more than 10 V) the collector-emitter saturated voltage $V_{CE(sat)}$, the depletion layer DL is allowed to reach the N$^+$ reverse conductive-type layer 14 (that is, a punch through occurs). As a result, the reverse voltage resistance of IGBT102 is regulated by the punch through so that the reverse voltage resistance is set to a value not more than 5 times the collector-emitter saturated voltage $V_{CE(sat)}$. Therefore, in the same manner as the IGBTs101, 101a of the first preferred embodiment, it becomes possible to use the IGBT102 as a switching element in an inverter without the necessity of connection to the freewheel diode.

Even when the N$^+$ reverse conductive-type layer 14 is installed, the basic switching operation serving as the IGBT is unchanged from the operation of conventional IGBTs151, 151a. Since the N$^+$ reverse conductive-type layer 14 is installed, the injection efficiency of holes from the P$^+$ collector layer 11 is reduced. However, in general, a life time killer is introduced to the N$^-$ base layer and the N$^+$ buffer layer 12 so that by adjusting the amount of the introduction of the life time killer, it is possible to compensate for a change in characteristics due to the reduction of the injection efficiency of holes.

In the IGBT102, the N$^+$ buffer layer 12 does not necessarily give an essential effect to the punch through. Therefore, even in a structure form in which the N$^+$ buffer layer 12 is omitted as shown as an IGBT102a in FIG. 10, it is possible to obtain the same effect as the IGBT102 with respect to the reverse voltage resistance. However, the IGBT102 having the N$^+$ buffer layer 12 makes it possible to provide a thinner N$^-$ base layer 13. Moreover, although not shown in the Figures, in the same manner as the IGBT101a (FIG. 2) of the first preferred embodiment, the MOS structure M of the IGBT102, 102a may be changed to a trench type, and the same effect is obtained with respect to the reverse voltage resistance.

The structure of IGBTs102, 102a is unchanged from the structure that has been conventionally adopted in IGBTs with high voltage resistance and generally referred to as "non-punch through structure", except for characteristics in the thickness of the P$^+$ collector layer 11 and the concentration of impurities. Therefore, in a method for manufacturing the IGBTs12, 102a also, the conventional method as it is may be adopted except that the thickness of the P$^+$ collector layer 11 and the concentration of impurities are controlled, as will be described below.

Figure 11:
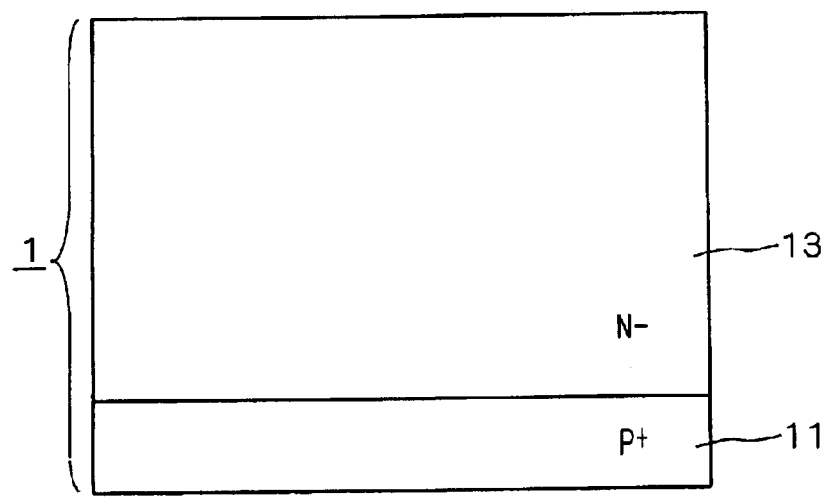
FIGS. 11 and 12 are drawings that show manufacturing processes in a manufacturing method of the IGBT in accordance with the second preferred embodiment.

Upon manufacturing the IGBTs102, 102a, first, an N$^-$ type silicon substrate 13 is prepared as shown in FIG. 8. Next, the P$^+$ layer 11 is formed on one major surface of the silicon substrate 13 by carrying out a process shown in FIG. 11. The P$^+$ layer 11 may be formed by implanting and diffusing impurities or utilizing the epitaxial growth. Next, as shown in FIG. 12, the N$^+$ reverse conductive-type layer 14 is formed by selectively implanting and diffusing N type impurities on the major surface to which the P$^+$ layer 11 is exposed.

Figure 12:
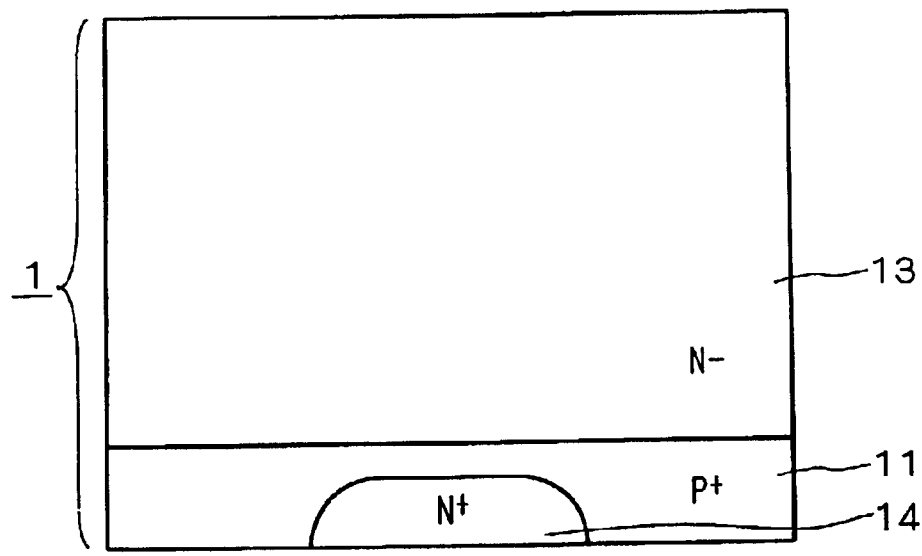
Figure 13:
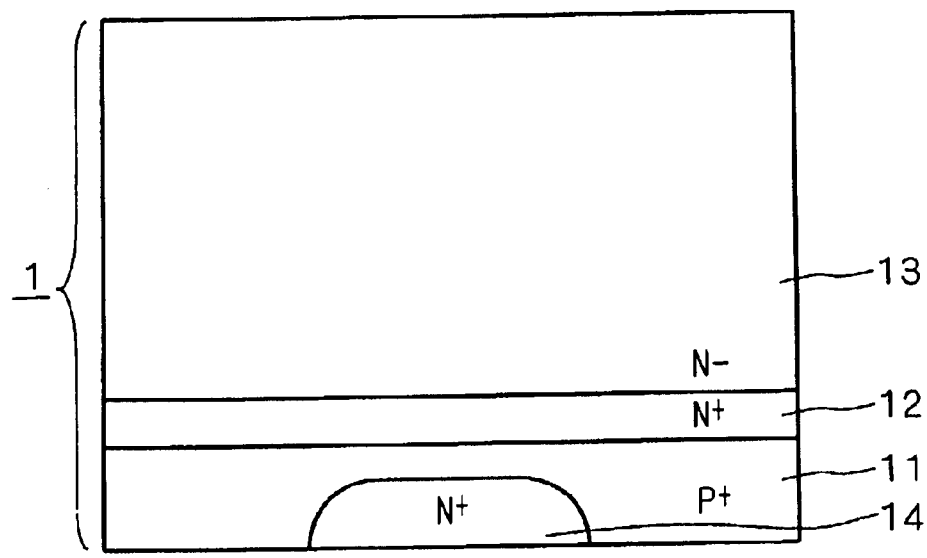
FIG. 13 is a drawing that shows a manufacturing process in another manufacturing method of the IGBT in accordance with the second preferred embodiment.

When the N$^+$ buffer layer 12 is formed, the N$^+$ buffer layer 12 and the P$^+$ collector layer 11 are formed on one major surface of the silicon substrate 13 in this order, as shown in FIG. 13 in place of FIG. 12, and N-type impurities are then selectively implanted and diffused on the major surface to which the P$^+$ layer 11 is exposed so that the N$^+$ reverse conductive-type layer 14 is formed. Both of the N$^+$ buffer layer 12 and the P$^+$ collector layer 11 may be formed by implanting and diffusing impurities or utilizing the epitaxial growth.

Figure 10:
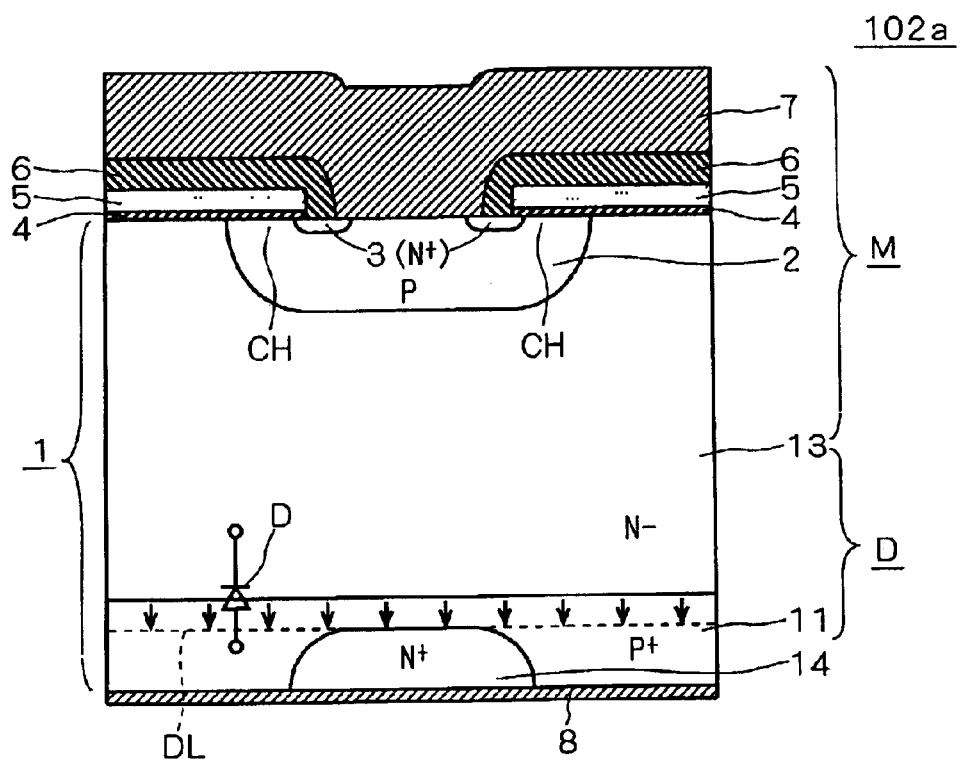
FIG. 10 is a front cross-sectional view of another example of IGBT in accordance with the second preferred embodiment.

Upon completion of the processes shown in FIG. 12 or FIG. 13, the MOS structure M and the collector electrode 8 are formed so that the IGBTs102, 102a are completed (FIG. 9 or FIG. 10).

3. Third Preferred Embodiment

Figure 14:
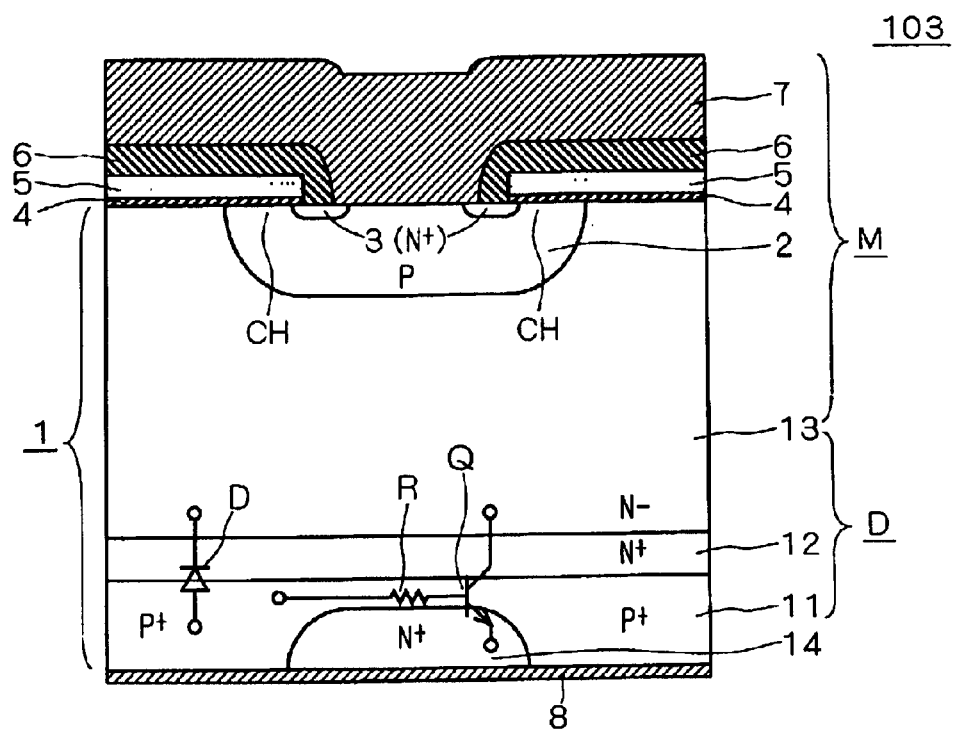
FIG. 14 is a front cross-sectional view of an IGBT in accordance with a third preferred embodiment.
Figure 15:
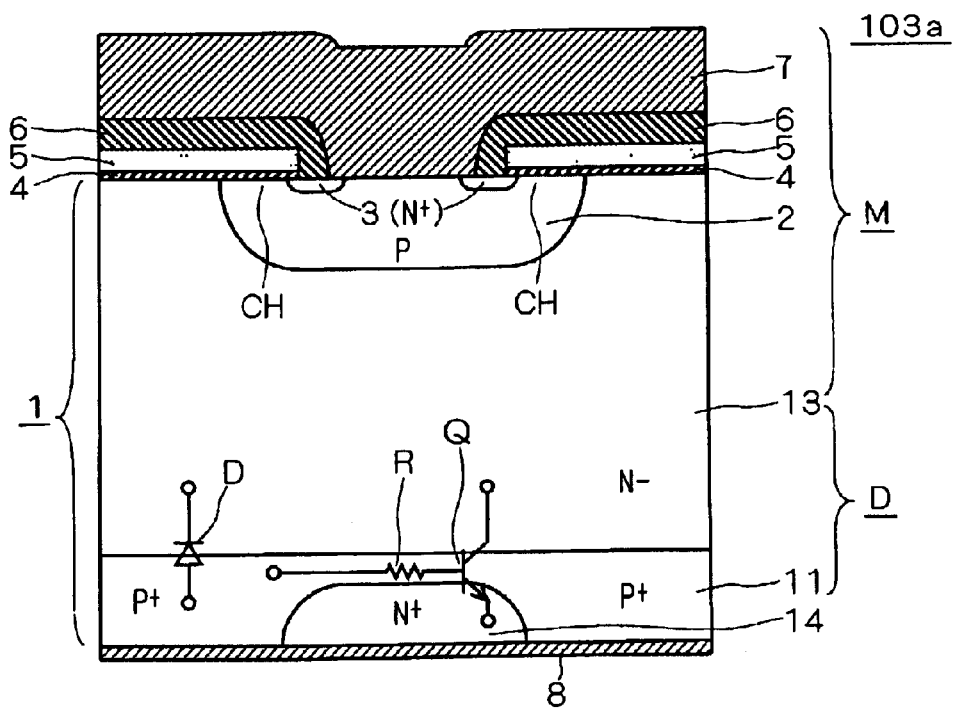
FIG. 15 is a front cross-sectional view of another example of IGBT in accordance with the third preferred embodiment.

FIGS. 14 and 15 are front cross-sectional views of IGBTs in accordance with the third preferred embodiment of the present invention. An IGBT103 shown in FIG. 14 and an IGBT103a shown in FIG. 15 are assembled in the same manner as the IGBTs102 and 102a of the second preferred embodiment, respectively, except for differences in the thickness of the P$^+$ collector layer 11 and the concentration of impurities. The N base layers 12, 13, the P$^+$ collector layer 11 and the N$^+$ reverse conductive-type layer 14 constitute an NPN-type parasitic bipolar transistor Q in an equivalent manner. An emitter of this parasitic bipolar transistor Q is connected to the collector electrode 8, and a base is connected to the collector electrode 8 through a resistor R. The resistor R corresponds to a resistance component belonging to a portion of the P$^+$ collector layer 11 sandwiched by the N base layers 12, 13 and the N$^+$ reverse conductive-type layer 14.

With respect to the IGBTs103, 103a, the thickness of the P$^+$ collector layer 11 (in particular, the thickness of a portion making the N$^+$ reverse conductive-type layer 14 and the N$^+$ buffer layer 12 separate from each other) and the concentration of impurities are adjusted so that, when a reverse voltage to be applied between the collector electrode 8 and the emitter electrode 7 is not more than 5 times (more preferably, not more than 10 V) the collector-emitter saturated voltage $V_{CE(sat)}$, a parasitic bipolar transistor Q is turned on. As a result, the reverse voltage resistance of IGBT103, 103a is regulated by turning-on of the parasitic bipolar transistor Q, and set to a value not more than 5 times the collector-emitter saturated voltage $V_{CE(sat)}$. Therefore, in the same manner as the IGBT101, 101a of the first preferred embodiment, the IGBT102 may be used as an inverter without the necessity of connection to the freewheel diode.

In the IGBT103, the N$^+$ buffer layer 12 does not necessarily give an essential effect to the turning-on of parasitic bipolar transistor Q. Therefore, the IGBTs103 and 103a are allowed to mutually obtain the same effect with respect to the reverse voltage resistance. However, the IGBT103 having the N$^+$ buffer layer 12 makes it possible to provide the thinner N$^-$ base layer 13. Moreover, although not shown in the Figures, in the same manner as the IGBT101a (FIG. 2) of the first preferred embodiment, the MOS structure M of the IGBT103, 103a may be changed to a trench type, and the same effects are obtained with respect to the reverse voltage resistance.

The structure of IGBTs103, 103a is the same as the structure of IGBTs102, 102a except for characteristics in the thickness of the P$^+$ collector layer 11 and the concentration of impurities. Therefore, the IGBTs103, 103a are easily manufactured by using the same processes as the manufacturing processes of the IGBT102, 102a. For this reason, with respect to the manufacturing method of the IGBT103, 103a, the detailed description thereof is omitted.

4. Fourth Preferred Embodiment

Figure 16:
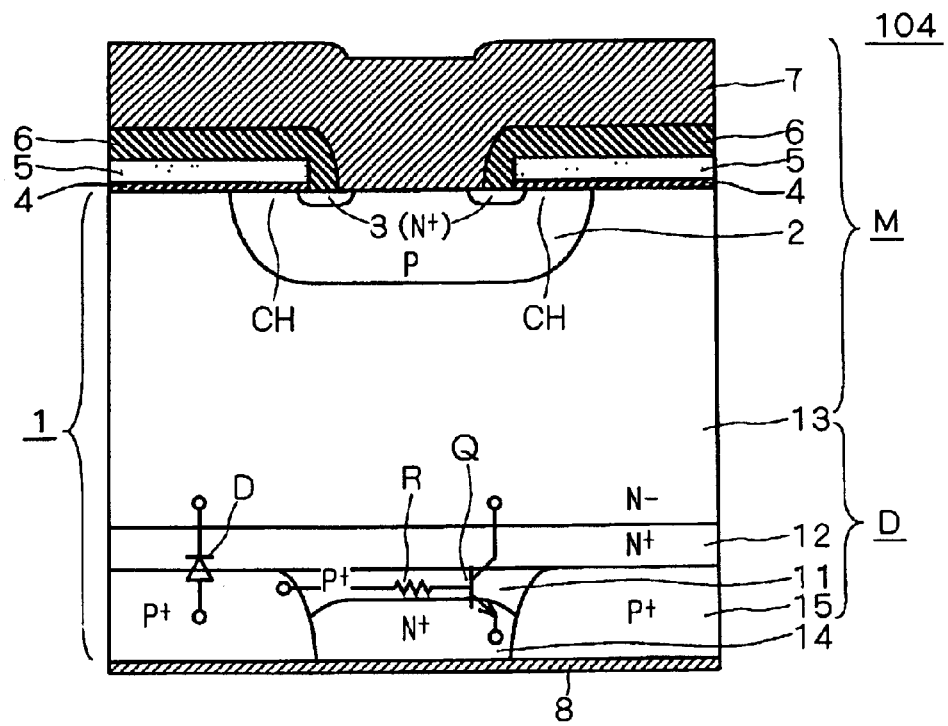
FIG. 16 is a front cross-sectional view of an IGBT in accordance with a fourth preferred embodiment.
Figure 17:
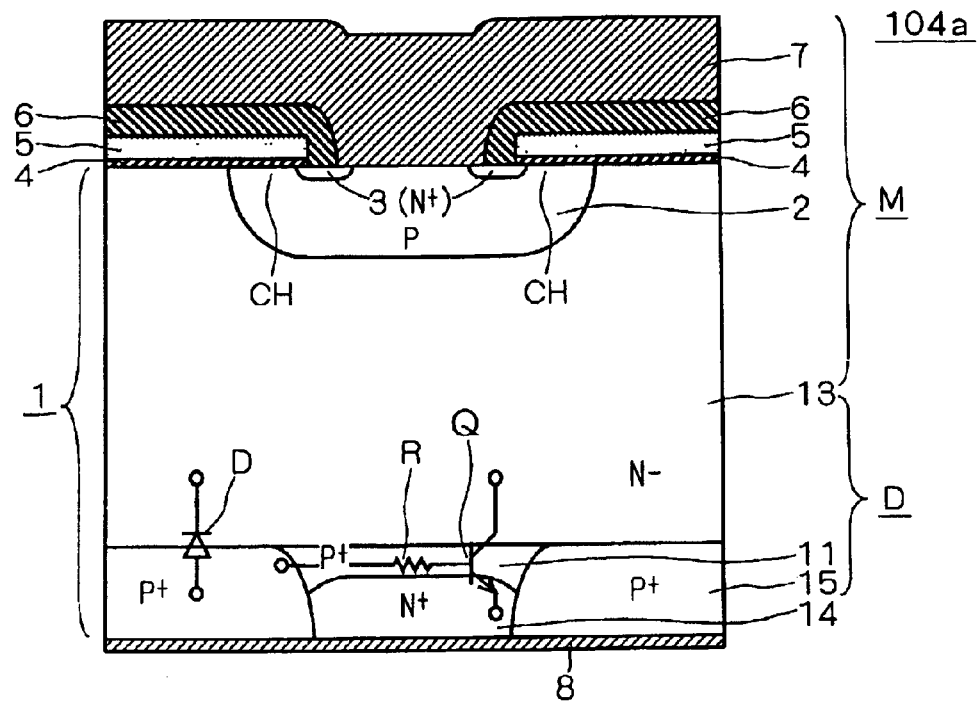
FIG. 17 is a front cross-sectional view of another example of IGBT in accordance with the fourth preferred embodiment.

FIGS. 16 and 17 are front cross-sectional views of an IGBT in accordance with the fourth preferred embodiment of the present invention. An IGBT104 shown in FIG. 16 is characterized in that a P$^+$ type diffusion layer 15 having a high concentration of impurities is selectively formed in the P$^+$ collector layer 11 of the IGBT102 in accordance with the second preferred embodiment or the IGBT103 in accordance with the third preferred embodiment. In the same manner, an IGBT104a shown in FIG. 17 is characterized in that a P$^+$ type diffusion layer 15 having a high concentration of impurities is selectively formed in the P$^+$ collector layer 11 of the IGBT102a in accordance with the second preferred embodiment or the IGBT103a in accordance with the third preferred embodiment.

In other words, in the IGBT104, 104a, the P$^+$ collector layer 11 comprises a P$^+$ layer 11a having a low concentration of impurities (for example, referred to as a "low-impurity-concentration collector layer") and a P$^+$ diffusion layer 15 having a high concentration of impurities (for example, referred to as a "high-impurity-concentration collector layer"). The P$^+$ diffusion layer 15 is formed in a manner adjacent to the N$^+$ reverse conductive-type layer 14 along the first major surface of the semiconductor substrate 1 by selectively diffusing P-type impurities in a portion of the first major surface of the semiconductor substrate 1 to which no N$^+$ reverse conductive-type layer 14 is exposed. The P$^+$ layer 11a corresponds to a portion of the P$^+$ collector layer 11 having no P$^+$ diffusion layer 15 formed thereon, that is, a portion sandwiched by the N$^+$ reverse conductive-type layer 14 and the N base layers 12, 13.

The basic operation of the IGBTs104, 104a is the same as that of the IGBTs102, 102a, 103, 103a in accordance with the second or third preferred embodiment. However, in the IGBTs102, 102a, 103, 103a, the N$^+$ reverse conductive-type layer 14 is formed inside the P$^+$ collector layer 11 with the result that the concentration of P-type impurities of the P$^+$ collector layer 11 needs to be reduced to a low level in comparison with the conventional IGBTs151, 151a. The resulting problem is that the amount of injection of holes from the P$^+$ collector layer 11 becomes low, causing the collector-emitter saturated voltage $V_{CE(sat)}$ to become higher. In contrast, in the IGBTs104, 104a, since the P$^+$ diffusion layer 15 having a high concentration of impurities is formed in a region out of the P$^+$ collector layer 11 in which no N$^+$ reverse conductive-type layer 14 is formed; therefore, it is possible to increase the amount of injection of holes from the P$^+$ collector layer 11 without impairing the function of N$^+$ reverse conductive-type layer 14, and consequently to reduce the collector-emitter saturated voltage $V_{CE(sat)}$.

Figure 18:
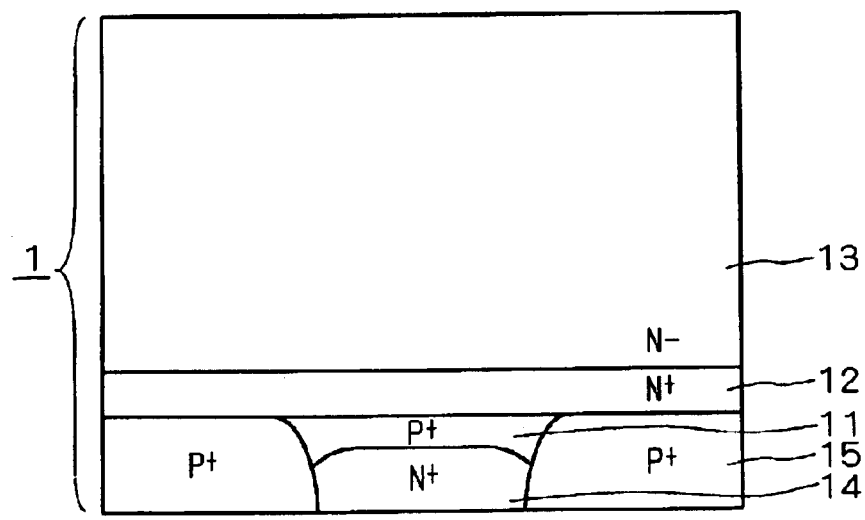
FIG. 18 is a drawing that shows a manufacturing process in a manufacturing method of the IGBT in accordance with the fourth preferred embodiment.

When the IGBT104 is manufactured, upon completion of processes shown in FIG. 13 for manufacturing the IGBT102, as shown in FIG. 18, P-type impurities are implanted with a high concentration to a region out of the exposed surface of the P$^+$ layer 11 in which no N$^+$ reverse conductive-type layer 14 is formed, and diffused therein; thus, the P$^+$ diffusion layer 15 is formed. The P$^+$ diffusion layer 15 is formed deeply in a manner so as to form a junction to the N$^+$ buffer layer. The processes to be carried out thereafter are the same as the manufacturing processes of the IGBT102 after the processes of FIG. 13.

Figure 19:
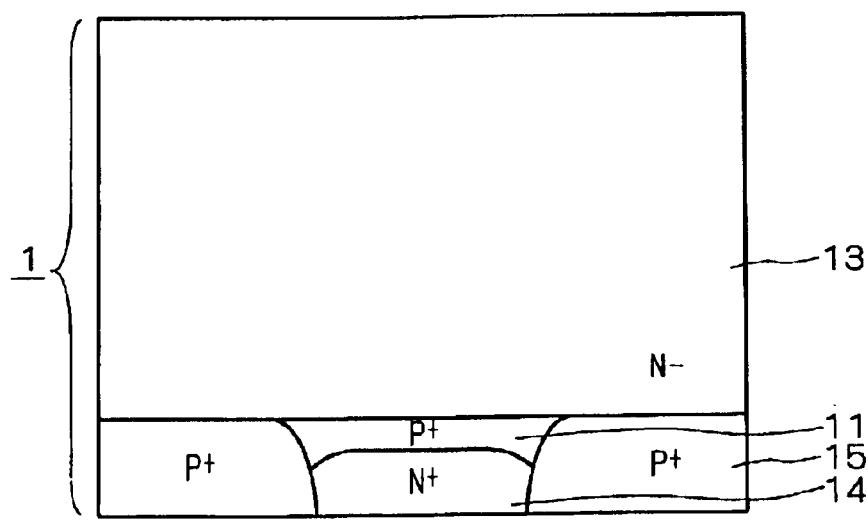
FIG. 19 is a drawing that shows a manufacturing process in another manufacturing method of the IGBT in accordance with the fourth preferred embodiment.

In the same manner, in the case of the manufacturing processes of the IGBT104a, after the processes of FIG. 12 for manufacturing the IGBT102a, as shown in FIG. 19, P-type impurities are implanted with a high concentration to a region out of the exposed surface of the P$^+$ layer 11 that has no N$^+$ reverse conductive-type layer 14 formed thereon, and diffused therein; thus, the P$^+$ diffusion layer 15 is formed. The P$^+$ diffusion layer 15 is formed deeply in a manner so as to form a junction to the N$^-$ base layer 13. The processes to be carried out thereafter are the same as the manufacturing processes of the IGBT102a after the processes of FIG. 12.

As described above, the IGBTs104, 104a are easily manufactured by adding a process for forming the P$^+$ diffusion layer 15 to a method for forming the IGBTs102, 102a, 103, 103a.

5. Fifth Preferred Embodiment

Figure 20:
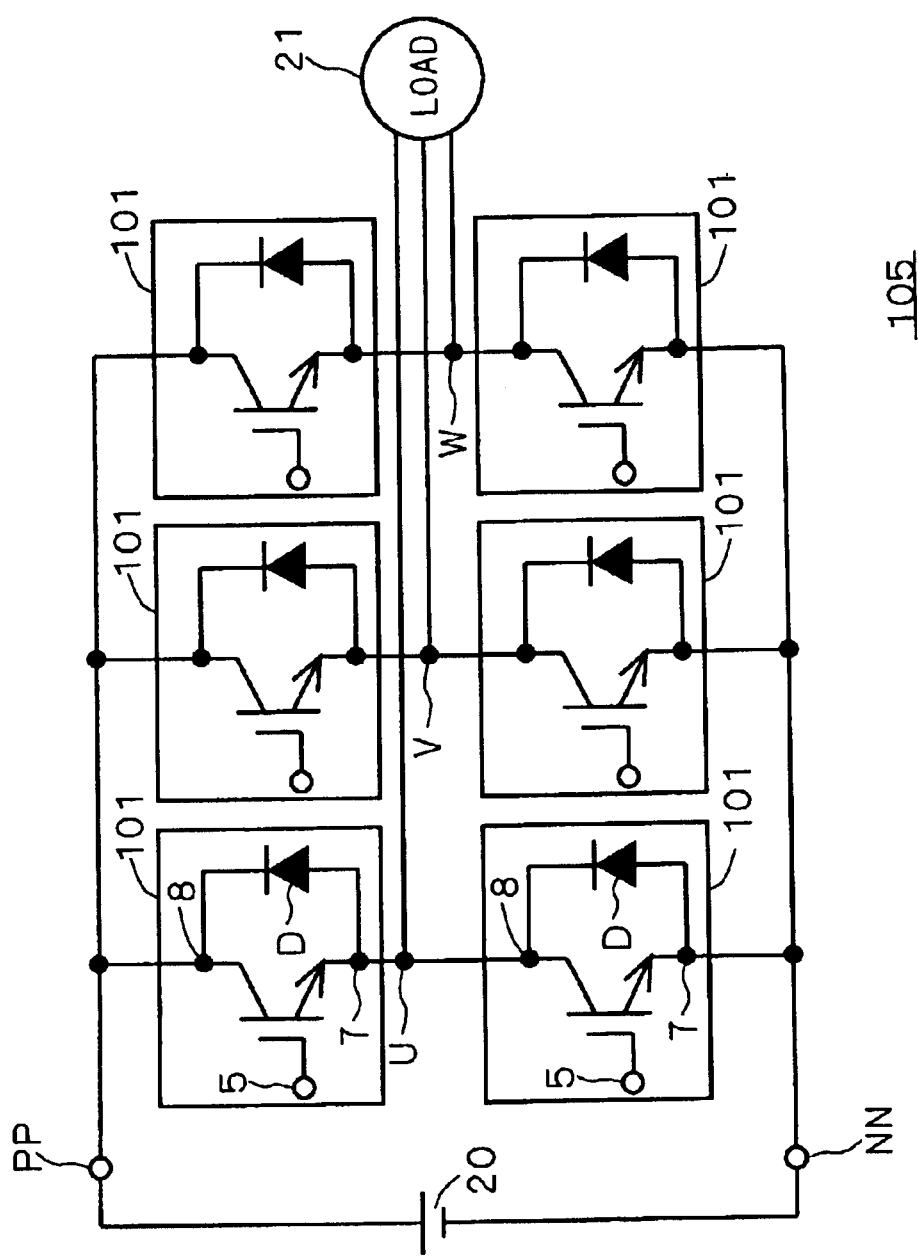
FIG. 20 is a circuit diagram that shows a semiconductor device in accordance with a fifth preferred embodiment.
Figure 31:
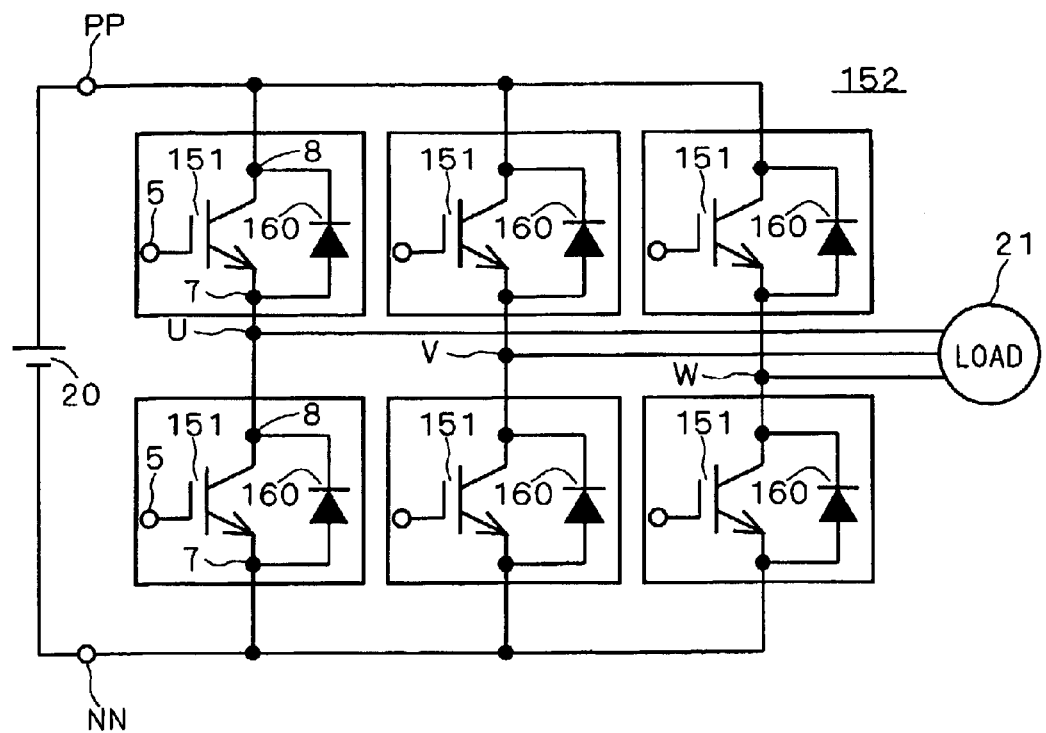
FIG. 31 is a circuit diagram of a semiconductor device in accordance with the conventional technique.

FIG. 20 is a circuit diagram (in which 101 is typically added as a reference number for an IGBT) of a semiconductor device using IGBTs101 to 104, 101a to 104a as switching elements. This semiconductor device 105 is formed as a three-phase inverter. Different from the conventional semiconductor device 152, the P+ collector layer 11 and the N base layers 12, 13 have characteristics as a freewheel diode so that the IGBT101 itself is allowed to function as a freewheel diode in an equivalent manner; therefore, it is not necessary to connect a freewheel diode 160 (FIG. 31) thereto in a separate manner. FIG. 20 also shows a freewheel diode in which the IGBT101 itself functions in an equivalent manner.

The six IGBTs101 are series-connected two by two. A collector electrode 8 of one of the series-connected two IGBTs101 is connected to a higher potential power-supply terminal PP, and an emitter electrode 7 of the other is connected to a lower potential power-supply terminal NN. That is, three series circuits, each having the two IGBTs101, are connected in parallel with each other between the higher potential power-supply terminal PP and the lower potential power-supply terminal NN. An external direct-current power-supply 20 is connected to the higher potential power-supply terminal PP and the lower potential power-supply terminal NN so that a direct current voltage is supplied thereto. In each of the series circuits, the connecting portion of the two IGBTs101 series-connected is connected to any one of output terminals U, V, W. For example, a load 21 such as a three-phase motor is connected to the three-phase output terminals U, V, W. Here, it is possible to form a single phase inverter by removing one of the three series circuits from the semiconductor device 105 of FIG. 20.

Gate voltage $V_{GE}$ is externally applied to six gate electrodes 5 installed in the six IGBTs101 individually so that the six IGBTs101 are selectively turned on and off. Thus, an alternating current of three phases is supplied to the load 21. The following description will discuss this operation in detail.

When the IGBT101 connected to the higher potential power-supply terminal PP is turned on in one of the series circuits with the IGBT101 connected to the lower potential power-supply terminal NN being turned on in another series circuit, a direct current voltage supplied by the direct-current power supply 20 is applied to the load 21. As a result, the current flowing through the load 21 gradually increases. When these IGBTs101, which have been turned on, are turned off, a current of the load 21 tries to flow continuously by energy accumulated in an induction L of the load 21, and flows through another IGBT101 that is series connected to the IGBT101 that has been turned on, as a reverse current.

Since the IGBT101 has its reverse voltage resistance set low so as to exert the same functions as the freewheel diode 160, the current of the load 21 continues to flow without being abruptly interrupted. With this arrangement, the load 21 is allowed to flow through the power supply 20 in a reversed direction. Accordingly, the energy accumulated in the induction L is gradually returned to the direct-current supply 20 so that the current decreases gradually. Since the reverse voltage resistance of IGBT101 is low, it is possible to prevent the energy accumulated in the induction L from being released to the IGBT101 abruptly.

Therefore, the current of the load 21 can be controlled by on-off operations of the IGBT101. In other words, an on-period and an off-period of the IGBT101 are appropriately adjusted with the IGBT101 being reciprocally turned on and off with a short cycle so that an average voltage to be applied to the load 21 is moderately changed in a sine-wave form; thus, a current having a sine-wave form in accordance with this sine-wave voltage and a power factor of the load 21 is allowed to flow. Since the load 21 such as a motor connected to an inverter has a high power factor, a phase of the sine-wave voltage and a phase of the sine-wave current are made virtually coincident with each other.

For this reason, during the period in which the sine-wave voltage becomes greatest, that is, the period in which the on-period ratio (the ratio of on-period) is the greatest, the current is virtually maximized, and during the period in which the off-period ratio (the ratio of off-period, that is, the ratio of period in which a reverse current flows through the IGBT101) is highest, the current is virtually minimized. Consequently, when these are time-averaged, the forward current, which flows through the IGBT101 when the IGBT101 is turned on, becomes not less than 5 times the reverse current that flows when the IGBT101 is turned off. In the IGBT101, the reverse voltage resistance is reduced to not more than 5 times the collector-emitter saturated voltage $V_{CE(sat)}$; therefore, the semiconductor device 105 is allowed to avoid damage to the IGBT101 while the structure for releasing loss heat generated in the IGBT101, that is, the heat-radiating structure, is the same as the conventional semiconductor device 152, without the necessity of connection to the freewheel diode 160.

6. Sixth Preferred Embodiment (Device Construction)

Figure 21:
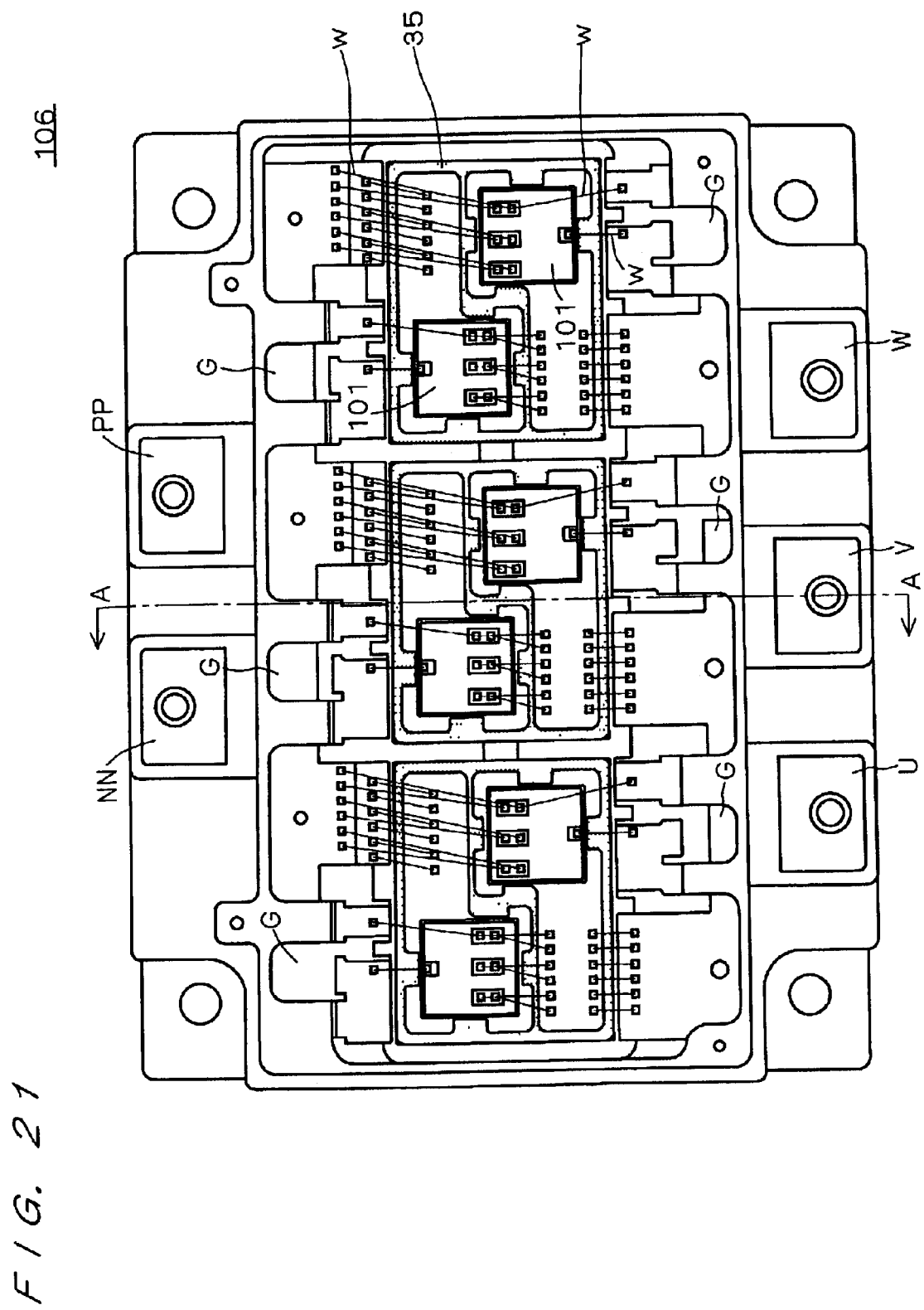
FIG. 21 is a plan view that shows a semiconductor device in accordance with a sixth preferred embodiment.
Figure 22:
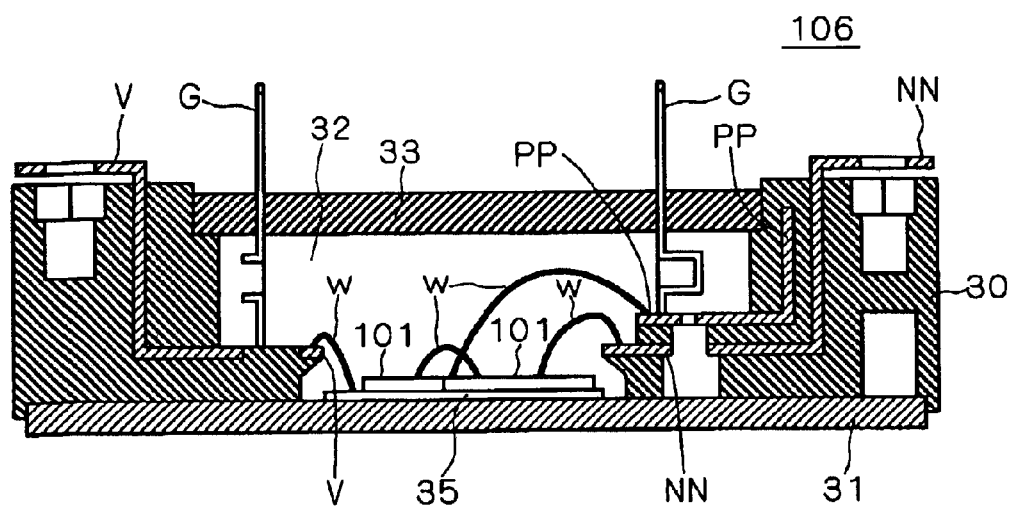
FIG. 22 is a cross-sectional view of the semiconductor device in accordance with the sixth preferred embodiment.

FIG. 21 is a plan view of a semiconductor device serving as an applied apparatus of the IGBTs101 to 104, 101a to 104a (in which the IGBT101 is typically shown). This semiconductor device 106 corresponds to a preferred specific structural example of the semiconductor device (that is, a three-phase inverter) 105 of FIG. 20. Therefore, a circuit diagram of the semiconductor device 106 is given in FIG. 20. FIG. 22 is a cross-sectional view of the semiconductor device taken along a line A—A of FIG. 21.

Figure 32:
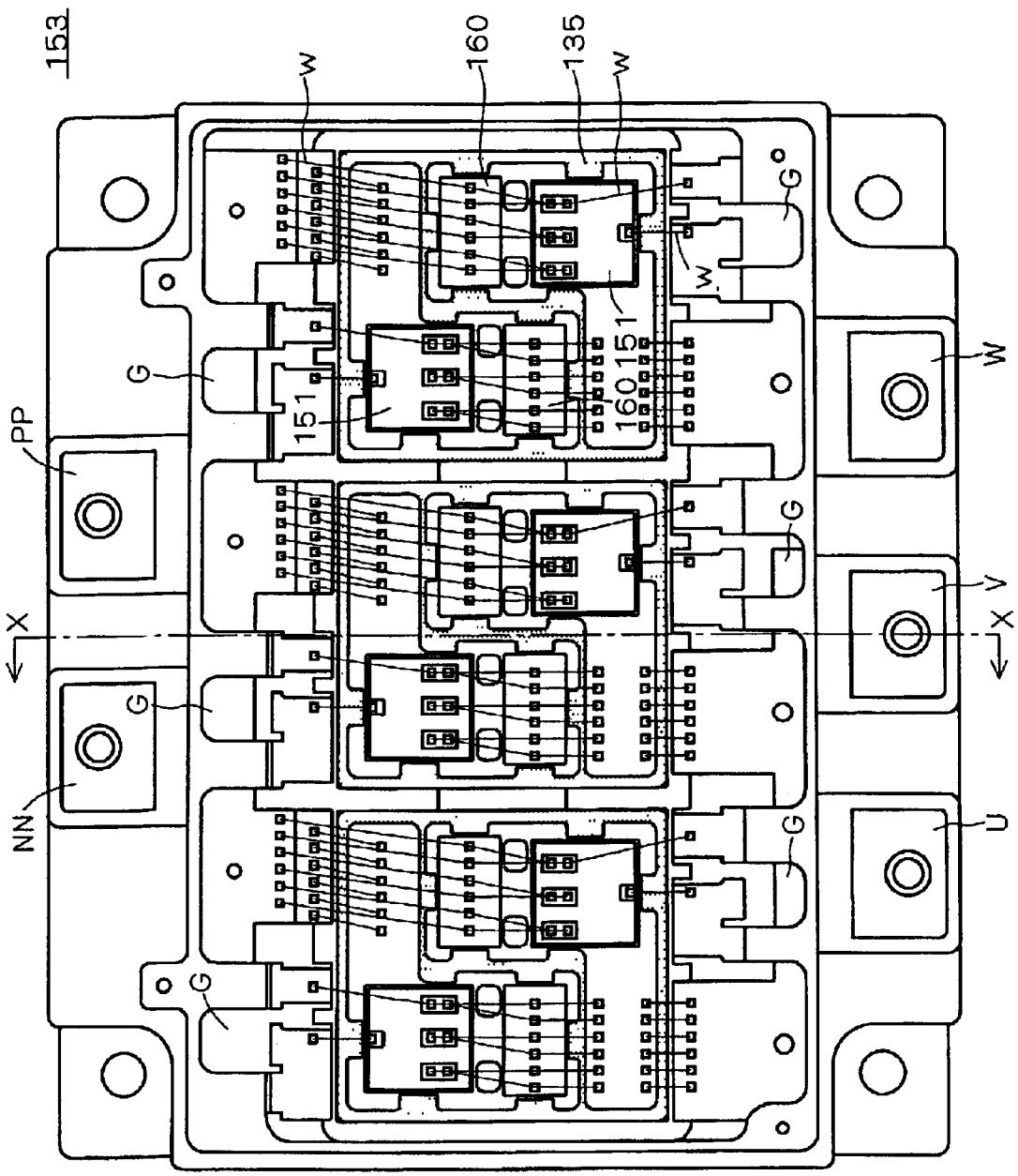
FIG. 32 is a plan view that shows another example of semiconductor device in accordance with the conventional technique.

The semiconductor device 106 comprises a housing 30, a heat-radiating plate 31 formed as one portion thereof, a substrate 35 placed on the heat-radiating plate 31, the six IGBTs101 placed on the substrate 35, the higher potential power-supply terminal PP, the lower potential power-supply terminal NN, the three output terminals U, V, W, the six gate terminals G, a number of conductive wires w and a lid 33. Different from the conventional semiconductor device 153 (FIGS. 32 and 33), no freewheel diodes 160 are placed on the substrate 35.

The housing 30 (including the heat-radiating plate 31) and the lid 33 cooperatively form a closed space 32, and the substrate 35 is mounted in this closed space 32. Each of the higher potential power-supply terminal PP, the lower potential power-supply terminal NN, the three output terminals U, V, W, and the six gate terminals G, is buried in the housing 30 so that its upper end portion protrudes from an upper portion of the housing 30, and its lower end portion is exposed to the closed space 32. The six IGBTs101 are connected to the eleven terminals PP, NN, U, V, W, G through a number of conductive wires w. The conductive wires w are, for example, aluminum wires. Here, FIG. 21 shows the semiconductor device 106 with its lid 33 being removed.

Figure 23:
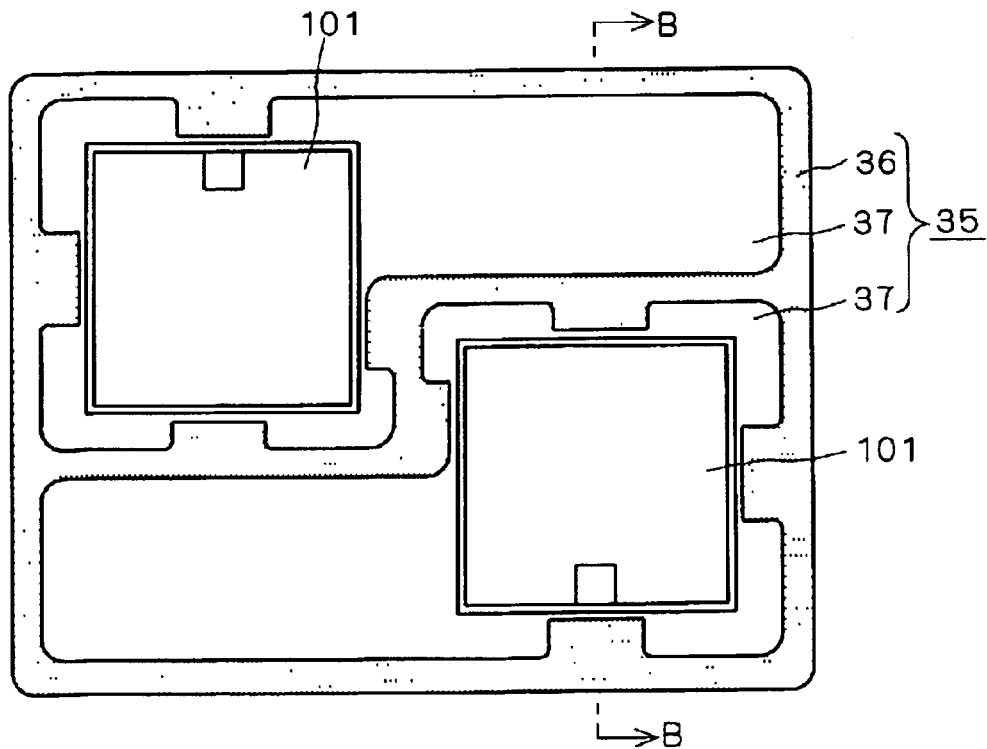
FIG. 23 is a plan view that shows a substrate in accordance with the sixth preferred embodiment.
Figure 24:
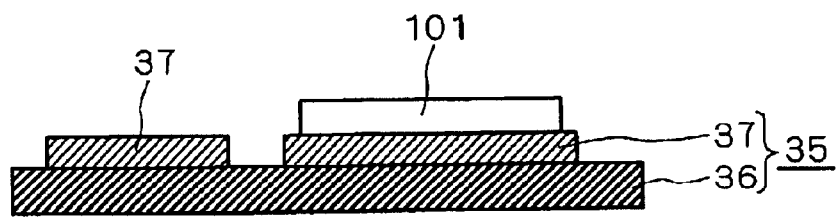
FIG. 24 is a cross-sectional view that shows the substrate in accordance with the sixth preferred embodiment.

FIG. 23 is a plan view of the substrate 35, and FIG. 24 is a cross-sectional view taken along a cutting line B—B of FIG. 23. FIGS. 23 and 24 simultaneously show the IGBT101 placed on the substrate 35. The substrate 35 comprises an insulating plate 36 and wiring patterns 37 placed thereon. The wiring pattern 37 is preferably made of copper as its major component. The insulating plate 36 is fixed on the heat-radiating plate 31 (FIG. 22), and the IGBT101 is mounted onto the wiring pattern 37, and electrically connected thereto. In this manner, each of the IGBTs101 is used in the form of bear chip.

The collector electrode 8 of each IGBT101 is connected to the wiring pattern 37. Moreover, the emitter electrode 7 of one of the two IGBTs101 constituting a series circuit is connected to the higher potential power-supply terminal PP through the conductive wire w, and connections between the emitter electrode 7 of the other and any one of the three output terminals U, V, W, between the collector electrodes 8 of the one and any one of the three output terminals U, V, W, and between the collector electrode 8 of the other and the lower potential power-supply terminal NN are made through the wiring pattern 37 and the conductive wire w. Moreover, each of the gate electrodes 5 of the six IGBTs101 is connected to the corresponding gate terminal G through the conductive wire w.

In the semiconductor device 106, since it is not necessary to install the freewheel diode 160, it is possible to make the size of the substrate 35 small in comparison with the conventional semiconductor device 153. This is clearly shown by the comparison between FIG. 34 and FIG. 23. Consequently, it is possible to further reduce the size of the entire semiconductor device 106 in comparison with the semiconductor device 153. Moreover, as clearly shown by comparison between FIG. 21 and FIG. 32, in the semiconductor device 106, it is possible to reduce the number of conductive wires w in comparison with the semiconductor device 153.

Figure 25:
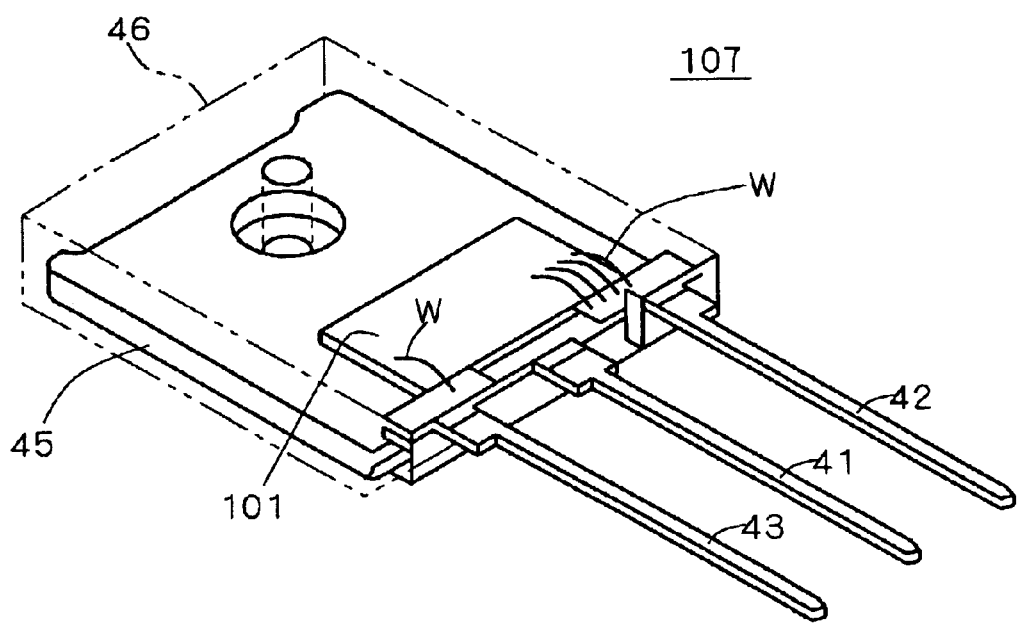
FIG. 25 is a perspective view that shows the semiconductor device in accordance with the sixth preferred embodiment.

FIG. 25 is an inner perspective view of a semiconductor device that shows another example of an applied apparatus. This semiconductor device 107 comprises a heat-radiating plate 125, an IGBT101 (which typically shows the IGBT101 to 104, 101a to 104a), a collector terminal 41, an emitter terminal 42, a gate terminal 43, conductive wires w and a sealing member 46 that seals all the elements except for the tip portions of the respective three terminals 41, 42, 43. A heat-radiating plate 45, which is made of cupper, and also referred to as a cupper frame, serves as a reinforcing member and a wiring pattern as well. Different from the conductive semiconductor device 154, no freewheel diode 160 is placed.

The collector electrode 8 of the IGBT101 is connected to the collector terminal 41 through the heat-radiating plate 45. Connections between the emitter electrode 7 of the IGBT101 and the emitter terminal 42 and between the gate electrode 5 of the IGBT101 and the gate terminal 43 are respectively made by the conductive wire w.

In the semiconductor device 107, since it is not necessary to install the freewheel diode 160, it is possible to reduce the size of the entire semiconductor device 106 in comparison with the conventional semiconductor device 154. Moreover, as clearly shown by comparison between FIG. 25 and FIG. 35, in the semiconductor device 107, it is possible to reduce the number of conductive wires w in comparison with the semiconductor device 154.

(Manufacturing Method of the Device)

Figure 27:
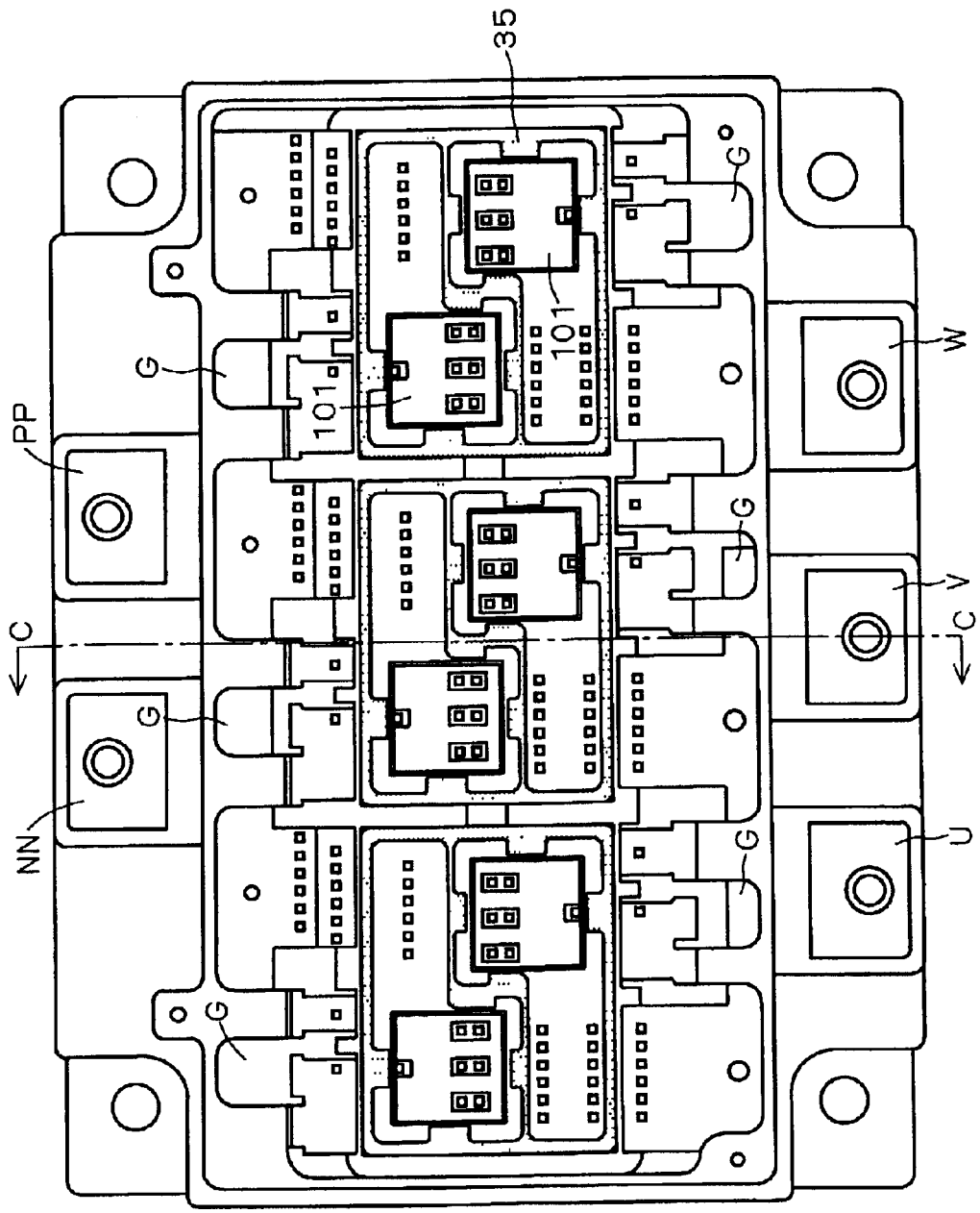
Figure 28:
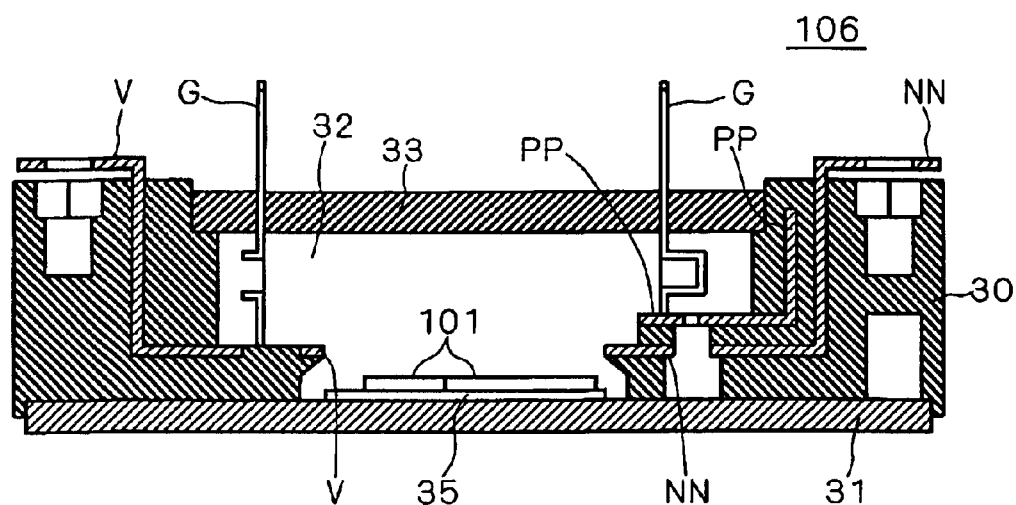

FIGS. 26 to 28 are manufacturing process drawings that show a method of manufacturing the semiconductor device 107. FIG. 28 is a cross-sectional view taken along a cutting line C—C of FIG. 27 that shows an intermediate product. When the semiconductor device 107 is manufactured, first, the IGBT101 is obtained by executing a manufacturing method in accordance with the first preferred embodiment. Simultaneously with this process, a substrate 35 (FIG. 26) and a housing 30 (FIGS. 27 and 28) are prepared. In the substrate 35, wiring patterns 37 are placed on an insulating plate 36. In the housing 30 with a heat-radiating plate 31 placed on its bottom portion, various terminals PP, NN, U, V, W, G are buried.

Next, the IGBT101 is fixed onto the wiring pattern 37 of substrate 35. Successively, the substrate 35 on which the IGBTs101 are placed is adhered to the heat-radiating plate 31 corresponding to the bottom plate of the housing 30. Thus, the IGBTs101 and the substrate 35 are mounted in a closed space 32. Next, as described by reference to FIG. 21 and FIG. 22, the respective electrodes 5, 7, 8 of the IGBT101 and the respective terminals PP, NN, U, V, W, G of the housing 30 are electrically connected through the conductive wires w. Then, by attaching the lid 33 to the upper portion of the housing 30, the semiconductor device 106 is completed. A semiconductor device including a direct-current power-supply 20 and/or a load 21 may be manufactured by connecting the direct-current power-supply 20 and/or the load 21 to the semiconductor device 106, and this may be shipped as a product.

When the semiconductor device 107 (FIG. 25) is manufactured, first, the IGBT101 is obtained by executing the manufacturing method in accordance with the first preferred embodiment. Simultaneously with this process, the three terminals 41, 42, 43 and the heat-radiating plate 45 are prepared. The heat-radiating plate 45 is connected to the collector terminal 42. Next, by fixing the IGBT101 onto the heat-radiating plate 45, the collector electrode 8 of the IGBT101 is electrically connected to the collector terminal 41. Next, the emitter electrode 7 of the IGBT101 is electrically connected to the emitter terminal 42 by using the conductive wires w, and the gate electrode 5 is electrically connected to the gate terminal 43. Thereafter, all the elements are sealed by a sealing member 46 except for a tip portion of each of the three terminals 41, 42, 43, which externally protrudes from the sealing member 46. The sealing member 46 is made of, for example, resin. After the above-mentioned processes, the semiconductor device 107 is completed.

In the manufacturing processes of the semiconductor devices 106, 107, it is neither necessary to place the freewheel diodes 160, nor necessary to electrically connect the freewheel diodes 160 to other portions; therefore, it is possible to further simplify the manufacturing processes in comparison with the manufacturing processes of the conventional semiconductor devices 153, 154. This fact is clearly indicated by a reduction in the number of conductive wires w to be used as well as a reduction in the number of processes used for attaching the conductive wires w. Thus, it becomes possible to reduce the size of the device and also to cut the manufacturing costs.

Modification

The above-mentioned preferred embodiments have been described by exemplifying N-channel-type IGBTs as IGBTs; however, this invention is of course applied to P-channel-type IGBTs.

While the invention has been described in detail, the foregoing description is in all aspects illustrative and not restrictive. It is understood that numerous other modifications and variations can be devised without departing from the scope of the invention.

What is claimed is:

1. An insulated gate bipolar transistor comprising:
   a semiconductor substrate having first and second major surfaces;
   a collector electrode which is located on said first major surface side of said semiconductor substrate; and an emitter electrode and a gate electrode that are located on said second major surface side, wherein said semiconductor substrate comprises:
- a collector layer of a first conductive type that is exposed to said first major surface and connected to said collector electrode; and
- a base layer of a second conductive type that is formed on said collector layer and is not exposed to said first major surface, and wherein said base layer and said collector layer have a characteristic as a freewheel diode.

2. The insulated gate bipolar transistor according to claim 1, wherein a reverse voltage resistance, which is a minimum value of a collector-emitter voltage when a reverse current flows between said emitter electrode and said collector electrode, is set to not more than 5 times a collector-emitter saturated voltage.

3. The insulated gate bipolar transistor according to claim 2, wherein said base layer comprises:
- a base main body portion; and
- a buffer layer that has a higher concentration of impurities than said base main body portion and is interpolated between said collector layer and said base main body portion, and
- a minimum value of a collector-emitter voltage when an avalanche current flows through a parasitic diode formed by said base layer and said collector layer is equivalent to said reverse voltage resistance.

4. The insulated gate bipolar transistor according to claim 2, wherein said semiconductor substrate further comprises:
- a reverse conductive-type layer of said second conductive type that is formed inside said collector layer so as not to be connected to said base layer, and selectively exposed to said first major surface, and connected to said collector electrode, and
- a minimum value of a collector-emitter voltage, that causes a punch through in which a depletion layer generated in a PN junction between said base layer and said collector layer reaches said reverse conductive-type layer, is equivalent to said reverse voltage resistance.

5. The insulated gate bipolar transistor according to claim 4, wherein said collector layer comprises:
- a low impurity concentration collector layer; and
- a high impurity concentration collector layer,
- said low impurity concentration collector layer comprises a portion of said collector layer sandwiched by said base layer and said reverse conductive-type layer, and
- said high impurity concentration collector layer has a concentration of impurities higher than said low impurity concentration collector layer.

6. The insulated gate bipolar transistor according to claim 2, wherein said semiconductor substrate further comprises:
- a reverse conductive-type layer of said second conductive type that is formed inside said collector layer so as not to be connected to said base layer, and selectively exposed to said first major surface and connected to said collector electrode, and
- a minimum value of a collector-emitter voltage when a parasitic bipolar transistor formed by said base layer, said collector layer and said reverse conductive type layer turns on, is equivalent to said reverse voltage resistance.

7. The insulated gate bipolar transistor according to claim 6, wherein said collector layer comprises:
- a low impurity concentration collector layer; and
- a high impurity concentration collector layer, and
- said low impurity concentration collector layer comprises a portion of said collector layer sandwiched by said base layer and said reverse conductive-type layer, and
- said high impurity concentration collector layer has a concentration of impurities higher than said low impurity concentration collector layer.

8. The insulated gate bipolar transistor according to claim 2, wherein said reverse voltage resistance is not more than 10 V.

9. A semiconductor device comprising:
- the insulated gate bipolar transistor according to claim 1;
- a housing in which the insulated gate bipolar transistor is mounted; and
- three terminals each of which is attached to said housing with its one portion protruding from said housing toward the exterior, and which are electrically connected to said gate electrode, said emitter electrode and said collector electrode of the insulated gate bipolar transistor, respectively.

10. The semiconductor device according to claim 9, wherein said gate electrode, said emitter electrode and said collector electrode are electrically connected to said three terminals through conductive wires, respectively.

11. The semiconductor device according to claim 9, further comprising:
- the insulated gate bipolar transistor serving as a first transistor;
- three insulated gate bipolar transistors having the same structure as said first transistor and serving as second through fourth transistors;
- said three-terminals serving as first to third terminals; and
- five terminals each of which is attached to said housing with one portion thereof protruding from said housing toward the exterior, said five terminals serving as fourth to eighth terminals, wherein
- said first and second transistors are series-connected,
- said third and fourth transistors are series-connected,
- said first terminal is electrically connected to said collector electrodes of said first and third transistors,
- said second terminal is electrically connected to connecting sections of said first and second transistors,
- said third terminal is electrically connected to said gate electrode of said first transistor,
- said fourth terminal is electrically connected to said emitter electrodes of said second and fourth transistors,
- said fifth terminal is electrically connected to connecting sections of said third and fourth transistors, and
- said sixth through eighth terminals are electrically connected to said gate electrodes of said second through fourth transistors, respectively.

12. The semiconductor device according to claim 11, further comprising:
- an inductive load connected to said second terminal and said fifth terminal.

13. A semiconductor device comprising:

the insulated gate bipolar transistor according to claim 1;

a sealing member that seals the insulated gate bipolar transistor; and three terminals each of which is sealed by said sealing member with one portion thereof protruding from said sealing member toward the exterior, said three terminals electrically connected to said gate electrode, said emitter electrode and said collector electrode of the insulated gate bipolar transistor, respectively.

14. A manufacturing method of an insulated gate bipolar transistor which comprises a semiconductor substrate having first and second major surfaces, a collector electrode that is located on said first major surface side of said semiconductor substrate, and an emitter electrode and a gate electrode that are located on said second major surface side, comprising the steps of:

(a) forming said semiconductor substrate so as to provide a collector layer of a first conductive type that is exposed to said first major surface and a base layer of a second conductive type that is formed on said collector layer and is not exposed to said first major surface; and (b) forming said collector electrode on said first major surface so as to be connected to said collector layer, wherein in said step (a), said semiconductor substrate is formed so that said base layer and said collector layer are allowed to have a characteristic as a freewheel diode.

15. The manufacturing method of the insulated gate bipolar transistor according to claim 14, wherein in said step (a), said semiconductor substrate is formed in such a manner that a reverse voltage resistance, which is a minimum value of a collector-emitter voltage when a reverse current flows between said emitter electrode and said collector electrode, is set to not more than 5 times the collector-emitter saturated voltage.

16. The manufacturing method of the insulated gate bipolar transistor according to claim 15, wherein in said step (a), said base layer comprises a base main body portion and a buffer layer that has a higher concentration in impurities than said base main body portion and is interpolated between said collector layer and said base main body portion, and said semiconductor substrate is formed so that a minimum value of a collector-emitter voltage when an avalanche current flows through a parasitic diode formed by said base layer and said collector layer is equivalent to said reverse voltage resistance.

17. The manufacturing method of the insulated gate bipolar transistor according to claim 15, wherein in said step (a), said semiconductor substrate further comprises a reverse conductive-type layer of said second conductive type that is formed inside said collector layer so as not to be connected to said base layer, and selectively exposed to said first major surface, and connected to said collector electrode, and said semiconductor substrate is formed so that a minimum value of a collector-emitter voltage that causes a punch through in which a depletion layer generated in a PN junction between said base layer and said collector layer reaches said reverse conductive-type layer is equivalent to said reverse voltage resistance.

18. The manufacturing method of the insulated gate bipolar transistor according to claim 15, wherein in said step (a), said semiconductor substrate further comprises a reverse conductive-type layer of said second conductive type that is formed inside said collector layer so as not to be connected to said base layer, and selectively exposed to said first major surface, and connected to said collector electrode, and said semiconductor substrate is formed so that a minimum value of a collector-emitter voltage when a parasitic bipolar transistor formed by said base layer, said collector layer and said reverse conductive type layer turns on is equivalent to said reverse voltage resistance.

* * * * *